United States Patent [19]

Perryman et al.

[11] Patent Number: 5,381,001
[45] Date of Patent: Jan. 10, 1995

[54] DETECTION CELL, A DETECTOR, A SENSOR, AND A SPECTROSCOPE USING A SUPERCONDUCTIVE TUNNELING JUNCTION

[75] Inventors: Michael A. C. Perryman, Leiden; Anthony Peacock, Noordwijkerhout; Clare L. Foden, Den Haag, all of Netherlands

[73] Assignee: Agence Spatiale Europeenne, Paris Cedex, France

[21] Appl. No.: 131,651

[22] Filed: Oct. 5, 1993

[30] Foreign Application Priority Data

Oct. 5, 1993 [FR] France ................. 92 11753

[51] Int. Cl.⁶ ............................................. H01J 40/14
[52] U.S. Cl. .................................. 250/214.1; 505/848
[58] Field of Search ............... 250/208.2, 214.1, 336.2; 307/277; 505/848

[56] References Cited

U.S. PATENT DOCUMENTS 5,179,072 1/1993 Bluzer .............................. 250/336.2
5,311,020 5/1994 Silver et al. ..................... 250/338.4

OTHER PUBLICATIONS

Nuclear Instruments and Methods in Physics Research, vol. A313, No. 1, 1 Mar. 1992, pp. 173–195, N. Rando et al.
IEEE Transactions on Applied Superconductivity, vol. 3, No. 1, Mar. 1993, pp. 2080–2083, N. Rando et al.
IEEE Transactions on Magnetics, vol. 25, No. 2, Mar. 1989, pp. 1351–1353, P. Gare et al.
Nuclear Instruments and Methods in Physics Research, vol. A288, No. 2,3, Mar. 15, 1990, pp. 541–548 F. Hebrank et al.

Primary Examiner—David C. Nelms
Assistant Examiner—K. Shami
Attorney, Agent, or Firm—Sughrue, Mion, Zinn, Macpeak & Seas

[57] ABSTRACT

The present invention relates mainly to a detection cell, a matrix detector using such cells, a sensor including such a detector, and a spectroscope including such a sensor. The invention provides a photon detection cell comprising a superconducting element, in particular of niobium, that is sensitive to photons of the radiation to be detected or to phonons generated by such photons, in particular by breaking Cooper pairs into quasi-particles and by means of a superconducting tunnel junction including a superconducting electrode, the cell being delimited by a plurality of spaced-apart superconducting tunnel junctions that are distributed around the periphery of the cell. The device of the invention is applicable to counting photons, and thus mainly to acquiring and processing information coming from faint radiation sources.

16 Claims, 14 Drawing Sheets

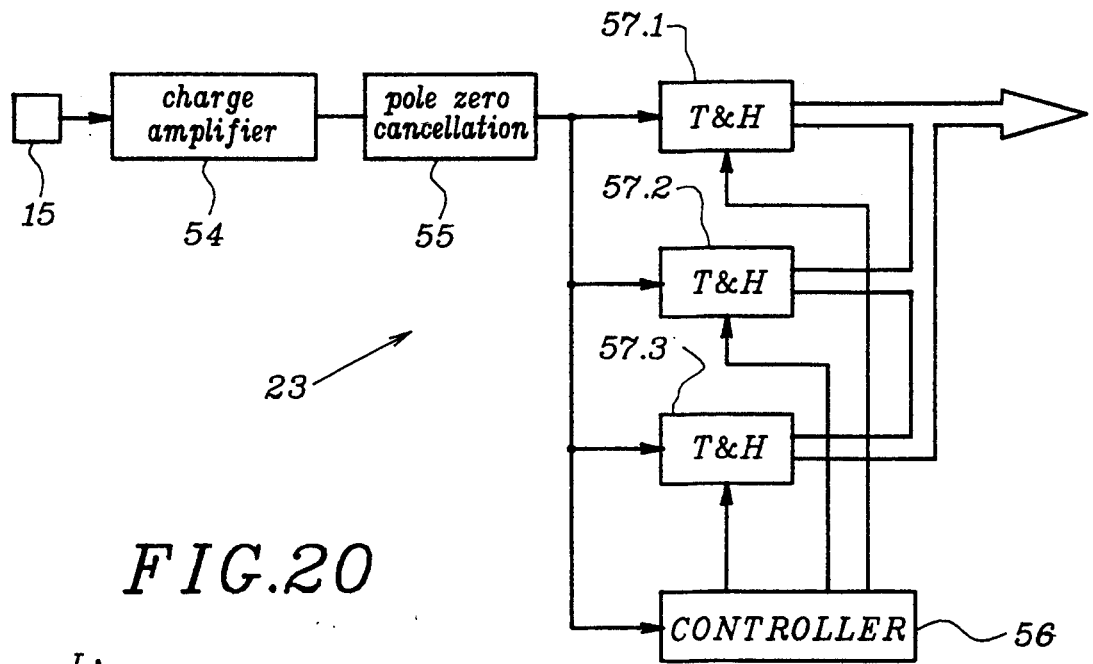
FIG.20
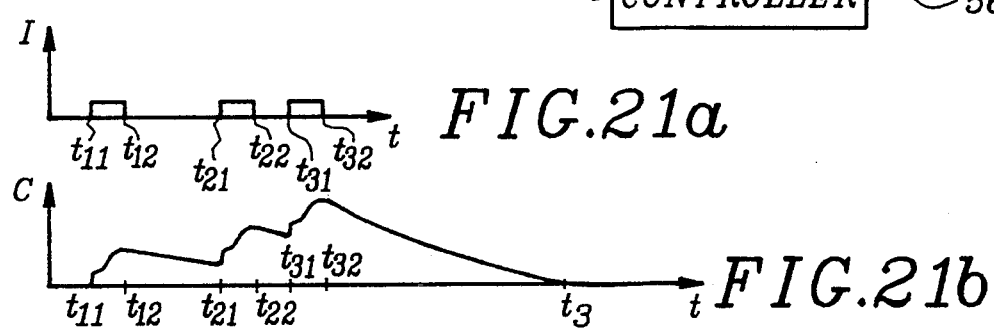
FIG.21a
FIG.21b
FIG.21c
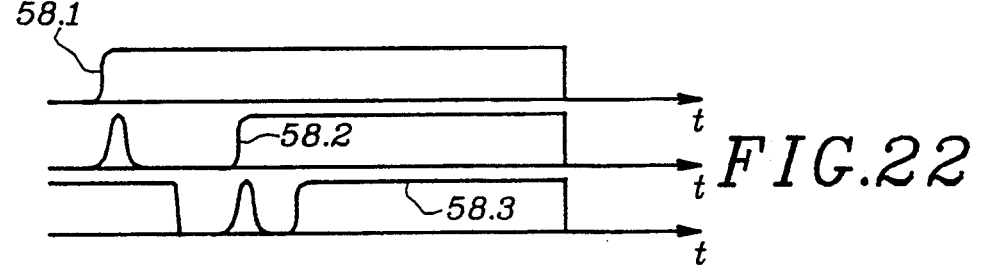
FIG.22

DETECTION CELL, A DETECTOR, A SENSOR, AND A SPECTROSCOPE USING A SUPERCONDUCTIVE TUNNELING JUNCTION

The present invention relates mainly to a detection cell, to a matrix detector implementing such cells, to a sensor including such a detector, and to a spectroscope including such a sensor.

BACKGROUND OF THE INVENTION

It is known that photons belonging to the X-ray band can be counted, i.e. individual X-ray photons can be detected, by making use of a junction between two superposed superconducting electrodes of niobium that are separated by a barrier of Al-AlO$_x$-Al. Such devices, as described in N. Rando, A. Peacock, A. van Dordrecht, C. Foden, R. Engelhardt, B. G. Taylor, P. Garé, J. Lumley and C. Pereira in Nucl. Instr. Meth. in Phys. Res. A 313 (1992) 173, have low quantum efficiency lying in the range 5% to 25%. Those devices are not at all sensitive to individual photons of lower energy, e.g. visible photons or ultraviolet (UV) photons.

The structure of such devices is briefly outlined with reference to FIG. 1.

Visible or UV photons have been counted, e.g. by means of light amplifiers having microchannels. Such devices have low quantum efficiency and, in addition, they are effective only in relatively narrow passbands.

Photon-counting devices using light amplifiers have low temporal resolution and no spectral resolution.

M. Kurakado, Nucl. Instr. Meth. in Phys. Res. A 314 (1992) 252 and Journal of Applied Physics, Vol. 59, No. 11, pp. 3807-14, describe a superconducting analog optical detector. Unlike a photon-counting device, an analog detector makes it possible to measure effects that result from collective interactions between the sensitive portion of the detector and a large number of optical photons.

A detector of that type can therefore have no temporal resolution concerning the arrivals of various individual photons. Similarly, it is impossible to know the energy of each photon (no spectral resolution).

OBJECTS AND SUMMARY OF THE INVENTION

Consequently, an object of the present invention is to provide a cell for counting photons over a wide band, in particular a band that extends from infrared to UV.

Another object of the present invention is to provide a photon-counting cell that presents high quantum efficiency.

Another object of the present invention is to provide a photon-counting cell that presents high temporal resolution.

Another object of the present invention is to provide a photon-counting cell that presents spectral resolution.

Another object of the present invention is to provide a detector including at least one such cell, and preferably a plurality of them.

Another object of the present invention is to provide such a detector including a matrix of such cells presenting spatial resolution.

Another object of the present invention is to provide a sensor including such a detector and presenting a high signal/noise ratio.

Another object of the present invention is to provide a highly sensitive spectroscope including such a sensor.

Another object of the present invention is to provide a sensitive interferometer enabling accurate data to be picked up concerning astronomical objects, the accuracy of the data picked up being undisturbed by movement in the layers of the atmosphere (coherence detection at two remote points).

These objects are achieved by implementing a detection cell that includes a superconducting element, in particular a photosensitive element in which the energy of each quasi-particle coming from the Cooper pair is reduced during interactions which increase the number of quasi-particles allowing the detection. The number of quasi-particles allowes the colour the photons to also be measured.

In a first variant embodiment, a detection cell is implemented that includes a superconducting sensitive element whose area is large relative to the area of the tunnel detection junction, or advantageously junctions.

In a second variant embodiment, close-together tunnel effect superconducting junctions are used enabling spatial resolution and temporal resolution of the cell to be increased.

Advantageously, superconducting channels having a forbidden band "energy gap" of $2\Delta$ that is narrower than that of the sensitive element, channelling the quasi-particles to be detected towards the detection junctions.

The present invention mainly provides a cell for detecting photons, the cell comprising a superconducting element, in particular made of niobium or of aluminum, that is sensitive to a photon of the radiation to be detected, or to phonons generated by such a photon by breaking Cooper pairs into quasi-particles and by means of a superconducting tunnel junction including a superconducting electrode, wherein, at its operating temperature, the photosensitive superconducting element has characteristics of energy gap $2\Delta$ and of thickness that enable the energy of each quasi-particle coming from a broken Cooper pair to be reduced while multiplying the number of quasi-particles by a factor greater than 100 to 1000 in a spectrum extending from near infrared to ultraviolet. By suitably selected superconducting materials of lower bandgap placed in proximity to the insulating barrier or by increasing the transmissivity of the barrier, an amplification by over 10 is possible.

The invention also provides a detection cell, wherein it is delimited by a plurality of spaced-apart superconducting tunnel junctions distributed around the periphery of the cell.

The invention also provides a detection cell, wherein it is delimited by a plurality of close-together superconducting tunnel junctions distributed around the periphery of the cell.

The invention also provides a cell, including walls around its periphery and terminating at the superconducting tunnel junctions, the walls being made of superconducting material, in particular Al, having an energy gap $2\Delta_2$ that is less than the energy gap $2\Delta_1$ of the material of the sensitive element, such that said walls form channels for channelling the quasi-particles towards the superconducting tunnel junctions, and the number of quasi-particles increases after a quasi-particle has diffused from the sensitive elements into a wall.

The invention also provides a cell, wherein its walls include discontinuities, preferably halfway between two adjacent superconducting tunnel junctions.

The invention also provides a cells, wherein the sensitive element is of small thickness and is deposited on a substrate that is transparent to the electromagnetic radiation to be sensed.

The invention also provides a cell, including a thin layer that absorbs the radiation to be sensed, said layer being disposed between the support and the sensitive element.

The invention also provides a cell, wherein the superconducting tunnel junction is made of aluminum covered by a niobium electrode-bonding layer.

The invention also provides a detector, comprising a plurality of cells of the invention, in particular a linear detector comprising cells aligned along an axis, or a matrix detector comprising cells aligned along rows and columns.

The invention also provides a sensor including a cell or a detector, including a low-noise amplifier connected to each superconducting tunnel junction to amplify the current of quasi-particles tunnelling through the junction.

The invention also provides a sensor, including analog-to-digital converters for digitizing the signals delivered by the amplifiers, and means for processing and/or storing the digitized signals.

The invention also provides a sensor, including encoding means responding to each digitized value of the signal delivered by an amplifier by delivering information relating to the position of the corresponding superconducting tunnel junction, the time of reception, and the value of the amplified current.

The invention also provides a sensor, including signal-shaping means and computer means for determining the charge induced in the superconducting tunnel junction by the photon to be detected on the basis of the shape of the signal transmitted by the signal-shaping means.

The invention also provides a sensor, including means for sampling the signal over time intervals that correspond to the detection of successive photons, and means for deducing therefrom the individual energy of each of the photons.

The invention also provides a sensor, including means for integrating the charge induced in a superconducting tunnel junction by a plurality of photons.

The invention also provides a spectroscope, including a sensor of the invention.

BRIEF DESCRIPTION OF THE DRAWINGS

The invention will be better understood from the following description and the accompanying figures given as non-limiting examples, and in which:

FIG. 20 is a block diagram of a second embodiment of an amplifier suitable for use in a detector of the present invention;

FIGS. 21a–21c and 22 are waveform diagrams comprising six curves that illustrate the signal processing performed by the FIG. 20 amplifier;

Throughout FIGS. 2 to 29, the same references are used to designate the same elements.

For reasons of clarity, FIGS. 7 to 11 are not to scale vertically. Likewise, the spacing between junctions 15 is given purely by way of non-limiting example.

MORE DETAILED DESCRIPTION

The structure of a known type of sensor is briefly outlined below with reference to FIG. 1, an intuitive indication of the interactions taking place in the device of the present invention is then given with reference to FIGS. 2 to 6; and reference is then made to FIGS. 7 to 12 while describing examples of structures suitable for implementation in a detector of the present invention. The theory on which a device of the present invention operates is then explained, and particular applications of the device of the present invention are then described with reference to FIGS. 13 to 15.

Figure 1:
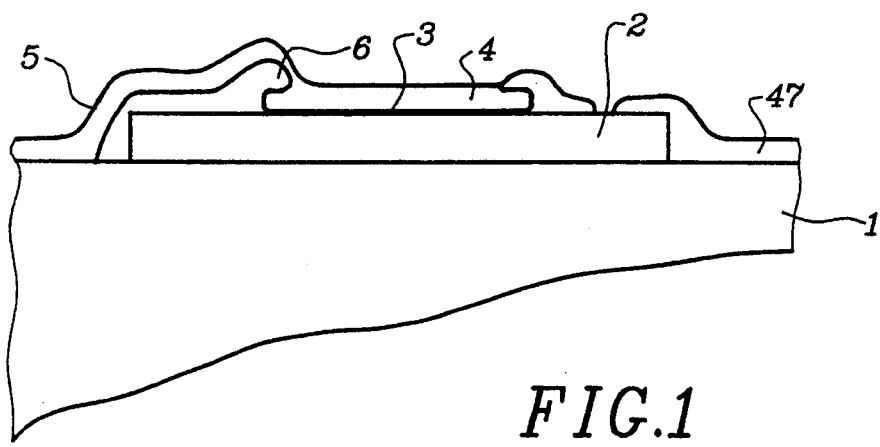
FIG. 1 is a vertical section through a known type of detector.

FIG. 1 shows a known type of detector comprising a first electrode 2 of niobium epitaxially formed on a sapphire substrate 1 that forms an inlet window that is transparent to X-rays. A barrier 3 constituted by a layer of aluminum, a layer of aluminum oxide ($AlO_x$) and a layer of aluminum is interposed between the first electrode 2 and a second electrode 4 made of polycrystalline niobium. A first niobium connection electrode 5 is connected to the second electrode 4 while being insulated from the second electrode 2 by an insulating layer 6 of $AlO_x$. A second niobium connection electrode 47 is connected to the first electrode 2.

A superconducting tunnel junction (STJ) is established through the barrier 3 between the first electrode 2 and the second electrode 4 over the major portion of the area of the detector.

In FIGS. 2 to 6 and 29, various interactions that take place in a detector of the present invention are shown diagrammatically. To the left of FIGS. 2 to 6 and 29, there can be seen the elements that interact, and to the right there can be seen the results of the interaction.

BCS quantum microscope theory (due to Bardeen, Cooper and Schrieffer) describes how electrons 7 which are fermions (spin $\frac{1}{2}$) minimize their energy by associating in pairs to form Cooper pairs 8 which are bosons (integer spin). This ordered state results from the existence in a superconductor of attraction between electrons via vibrations of the atomic lattice. This attraction is greater than the electrostatic repulsion forces between two electrons of the same charge.

Figure 2:
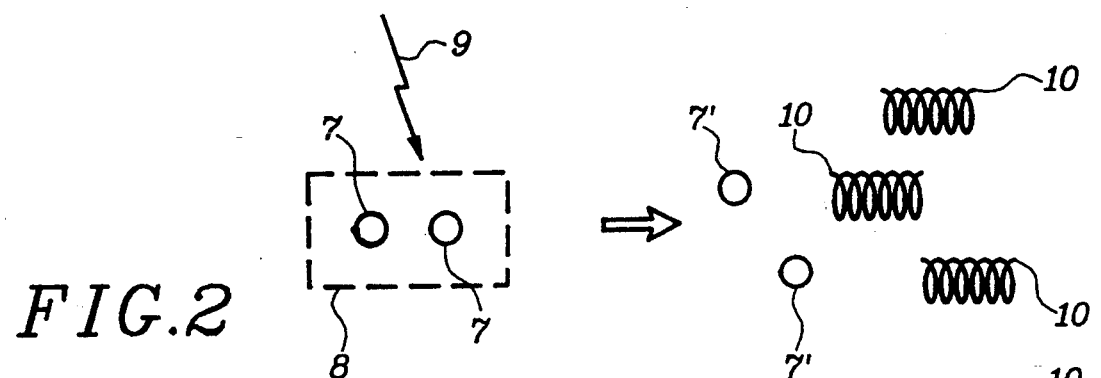
FIGS. 2 to 6 are diagrams providing an intuitive representation of the interactions that take place in the device of the present invention.

In FIG. 2, there can be interaction between a photon 9 and a Cooper pair 8. The photon can interact with band electrons in the atom (not illustrated) and create hot electrons which also can break Cooper pairs and create phonons. When the energy of the photon 9 is greater than the width of the forbidden band or "energy gap" $2\Delta$ of the excitation spectrum of the superconductor, there exists a probability of interaction between the photon 9 and a Cooper pair, resulting in two quasi-particles 7' being generated that correspond to the electrons, together with phonons 10 that form the quantum energy of the mechanical vibration field due to agitation of the atoms in the superconducting lattice.

At very low temperatures, e.g. less than $0.1\,T_c$ (where $T_c$ is the critical temperature of the superconductor) the probability of encountering a phonon 20 of energy equal to or greater than $2\Delta$ is substantially zero. Thus, it can be said that all phonons of energy greater than or equal to $2\Delta$ come from the interaction between a phonon 9 and a Cooper pair 8 (and thus corresponds to detection of the arrival of a photon).

Figure 3:
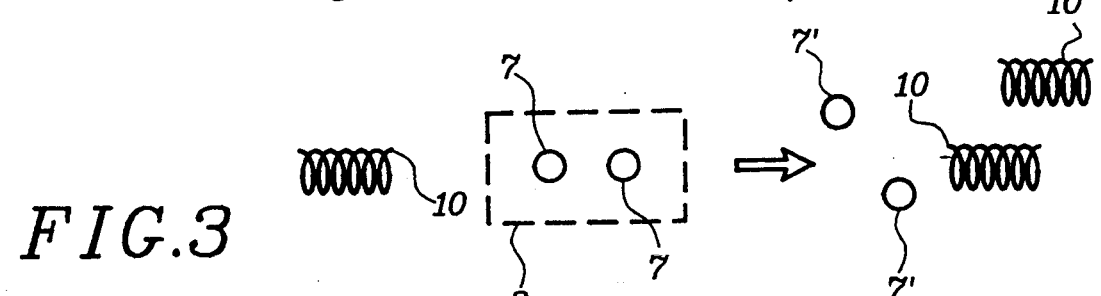

Phonons of energy less than $2\Delta$, coming directly from interaction between photons 9 and the Cooper pair 8 or else obtained by relaxation do not participate in the detection of individual photons, as provided by the present invention. In contrast, as can be seen in FIG. 3, a phonon 10 of energy greater than or equal to $2\Delta$ may break a Cooper pair 8 to generate two electrons 7' together with further phonons 10 of lower energy. Quasi-particles 7' are thus generated and propagated and firstly this increases the quantum efficiency of the detector of the invention (probability of detecting a photon 9 that has interacted with a Cooper pair); and secondly it makes it possible to deduce the energy of the incident photon 9 on the basis of the number of quasi-particles 7' that have tunnelled through the superconducting junction(s).

Figure 4:
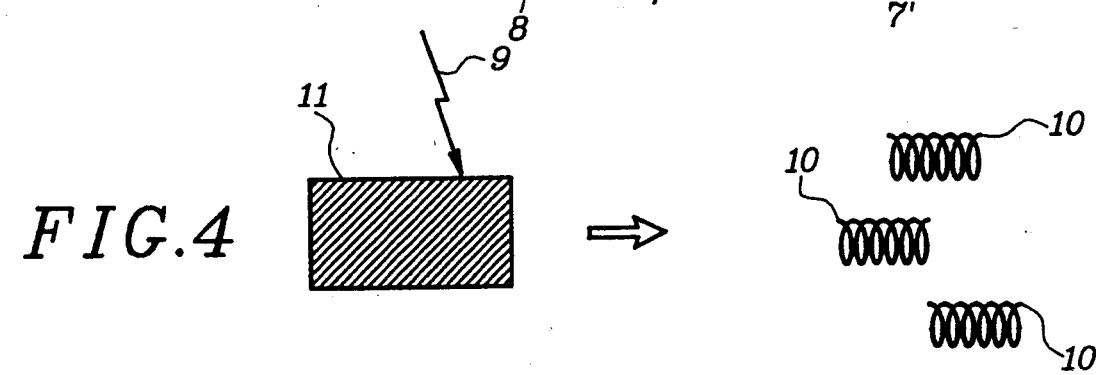

FIG. 4 shows the interaction between a photon 9 and matter 11, e.g. the superconducting lattice or with an absorbent layer deposited on its surface, in particular a layer of copper. When the photon 9 is absorbed by the matter 11, phonons 10 appear which are capable of breaking Cooper pairs 8 as outlined in FIG. 3.

Figure 5:
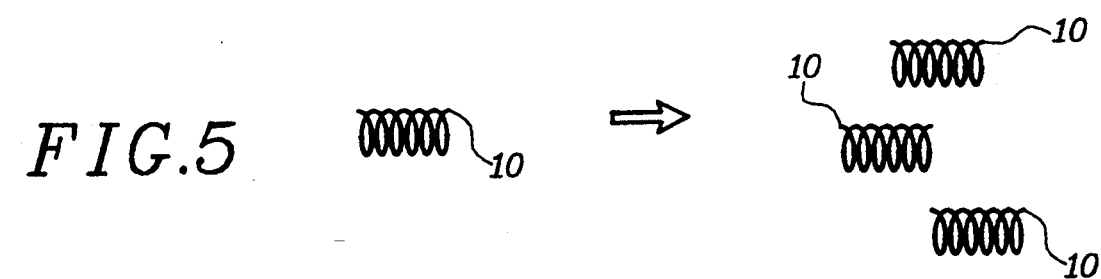

As can be seen in FIG. 5, the relaxation of a higher energy phonon 10 may give rise to lower energy phonons 10 being generated. It should be observed that phonons 10 of energy less than the energy gap $2\Delta$ of the excitation spectrum of the superconducting lattice cannot break Cooper pairs 8.

Figure 6:
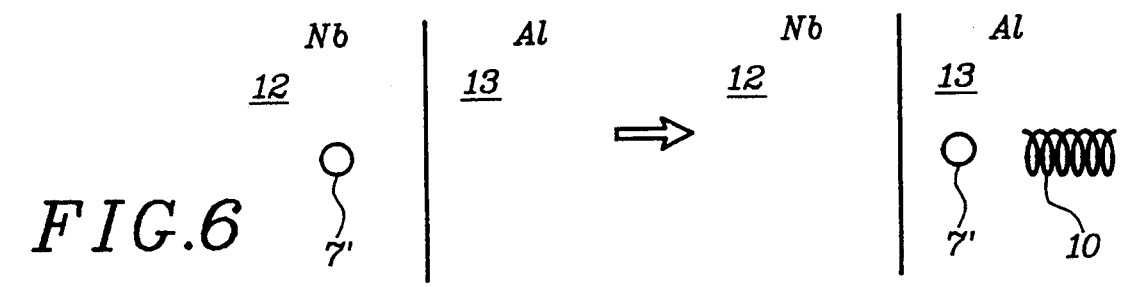

FIG. 6 shows a quasi-particle 7' passing from a first superconductor 12, e.g. of niobium, having a first energy gap $2\Delta_1$ to a second superconducting material 13, e.g. aluminum, having a second energy gap $2\Delta_2$ less than $2\Delta_1$. The passage of the quasi-particle 7' from the medium 12 to the medium 13 generates a phonon 10 which, by means of the mechanism shown in FIG. 3, generates other quasi-particles 7' by breaking other Cooper pairs 8. For example, passing from niobium where $\Delta$ is equal to 1.5 meV (1 eV is equal to 1.602 $10^{-10}$J), towards aluminum where $\Delta$ is equal to 0.3 meV, corresponds to the number of quasi-particles 7' being multiplied by a factor equal to 4.5.

Figure 29:
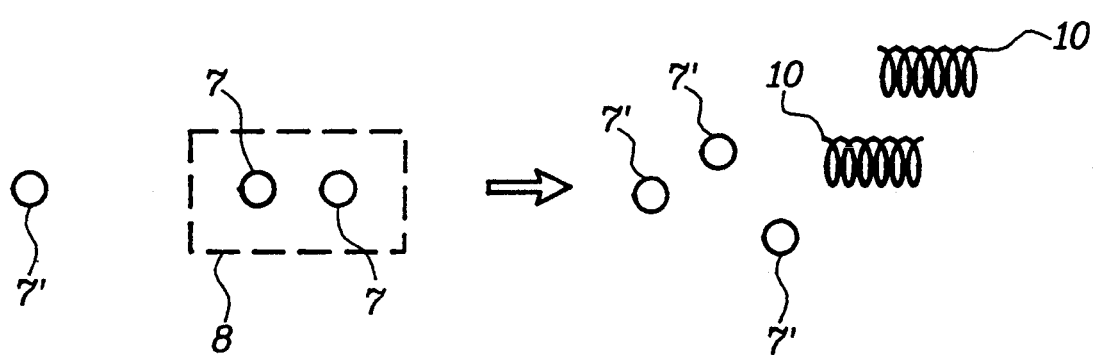
FIG. 29 is a diagram intuitively representing the interaction that takes place in the device of the present invention.

FIG. 29 shows the interaction between a Cooper pair 8 and a quasi-particle 7' whose energy is greater than the bonding energy of the Cooper pair. This gives rise to three lower energy quasi-particles 7' and to phonons 10. This phenomenon, which makes it possible to amplify the number of quasi-particles 7' characteristic of absorption of a photon 9 to be detected, is greater in superconducting materials with smaller energy gaps, e.g. aluminum, than in superconducting materials with larger energy gaps such as niobium.

FIGS. 7 to 11, 16, and 17 show various embodiments of cells or detectors of the present invention.

Figure 7:
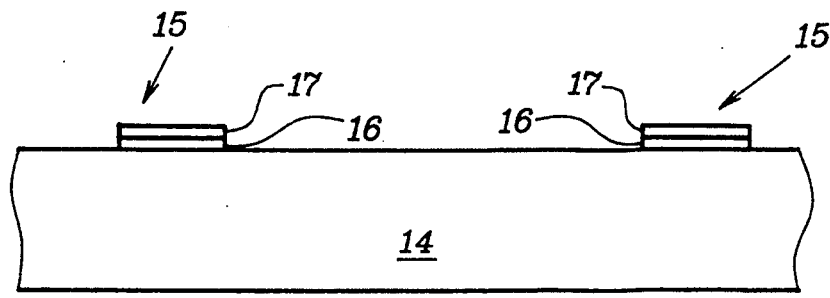
FIG. 7 is a vertical section through a first embodiment of a detector of the present invention.

In FIG. 7, there can be seen a superconducting sensitive element 14 in which spatially-distributed cells are defined by superconducting tunnel junctions 15 each comprising a thin insulating barrier 16 and a superconducting electrode 17. In this embodiment, the sensitive element 14 is sufficiently thick and sufficiently stiff to constitute the mechanical structure of the cells and/or of the detector, or else it is supported by a substrate situated on the rear face of the detector (not shown). The sensitive element may form a support either above or below the junctions.

Figure 8:
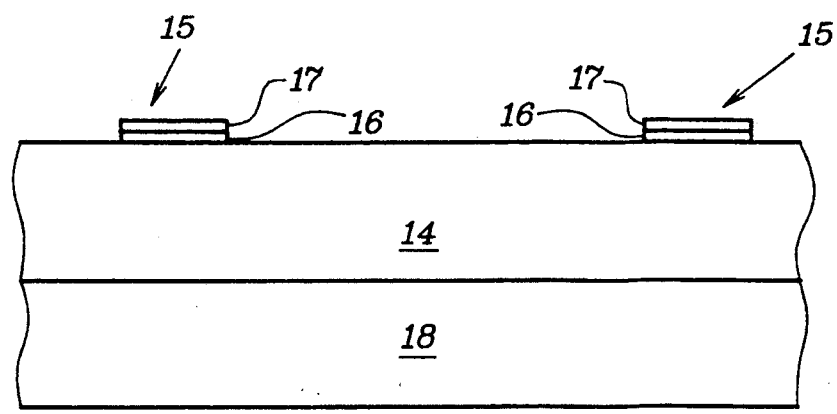
FIG. 8 is a vertical section through a second embodiment of a detector of the present invention.

In contrast, in the embodiment shown in FIG. 8, the sensitive element 14 is deposited on a rigid substrate 18 that is transparent to radiation in the frequency band containing the photons that are to be detected. The substrate 18 must be compatible with the materials of the element 14, including at the very low temperatures required for establishing superconductivity.

If the sensitive element is of niobium, it is possible to use sapphire, for example, when detecting visible photons. The support 18 may then be made of sapphire. However, when detection is to extend into the ultraviolet, the support 18 may be made of Mg $F_2$.

Figure 9:
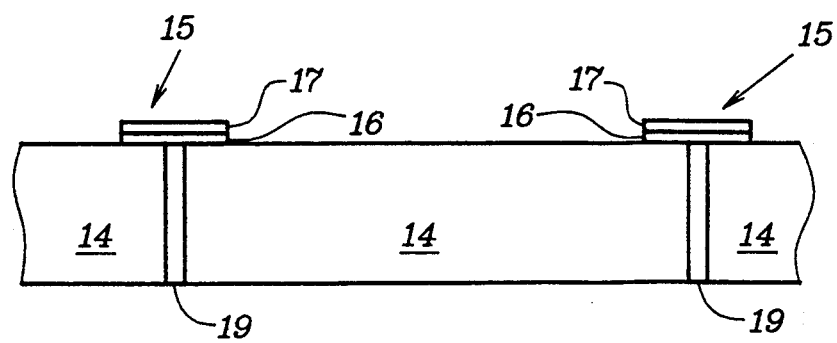
FIG. 9 is a vertical section through a third embodiment of a detector of the present invention.

FIG. 9 relates to junctions being widely spaced apart and shows a detector of the present invention that includes walls 19 defining limits between detection cells and forming channels for channelling the quasi-particles 7' towards the superconducting tunnel junctions 15. To enhance multiplication of the quasi-particles 7' and to prevent them migrating towards the sensitive element 14 as shown in FIG. 6, the walls 19 are made of a superconducting material whose energy gap is smaller than the energy gap of the superconducting sensitive element 14.

When the sensitive element 14 is made of niobium, the walls 19 are advantageously made of aluminum.

Figure 10:
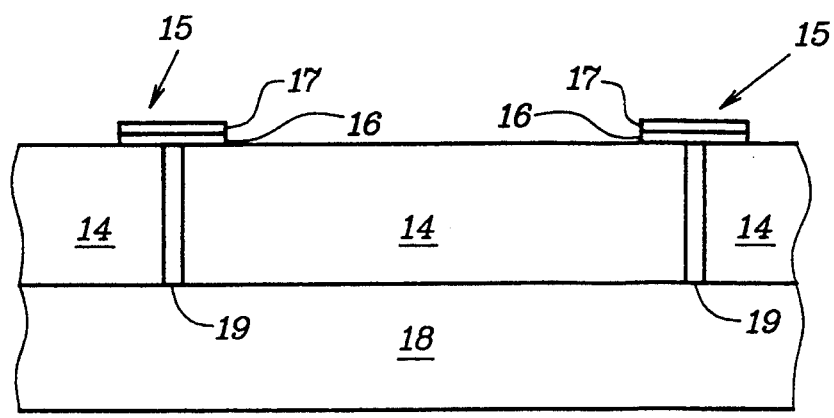
FIG. 10 is a vertical section through a preferred embodiment of a detector of the present invention.

FIG. 10 shows the preferred embodiment of the device of the present invention which comprises the structure of FIG. 9 deposited on a substrate 18.

Figure 11:
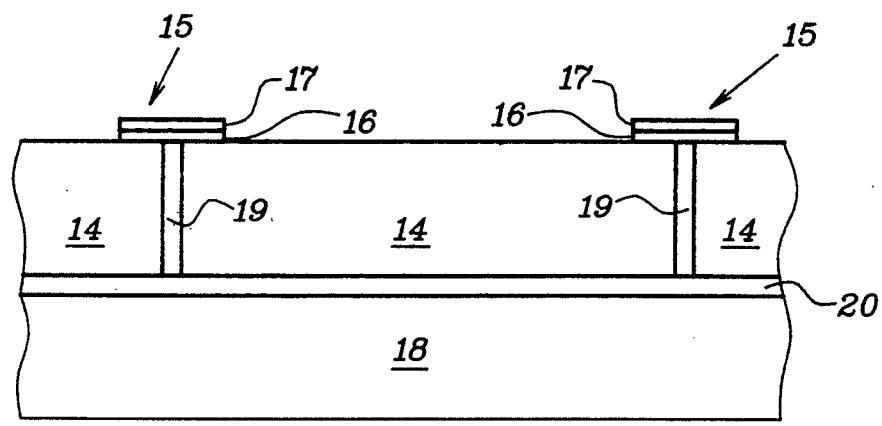
FIG. 11 is a vertical section through a fifth embodiment of a detector of the present invention.

FIG. 11 shows a structure that comprises, between the substrate 18 and the sensitive element 14, an absorbent layer that is made of copper, for example. The copper layer thermalizes the photons 9, i.e. it absorbs them and converts them into phonons 10 in application of the principles shown in FIG. 4.

The device shown in FIG. 11 has very high temporal resolution.

The detection cell and the detector of the present invention have quantum efficiency close to unity when a photon is absorbed by the sensitive element 14 or by the absorbent layer 20. When a photon is absorbed by a wall 19, quantum efficiency is still close to unity, but there will be a higher quantity of quasi-particles, and the response is limited to a single junction.

Figure 12:
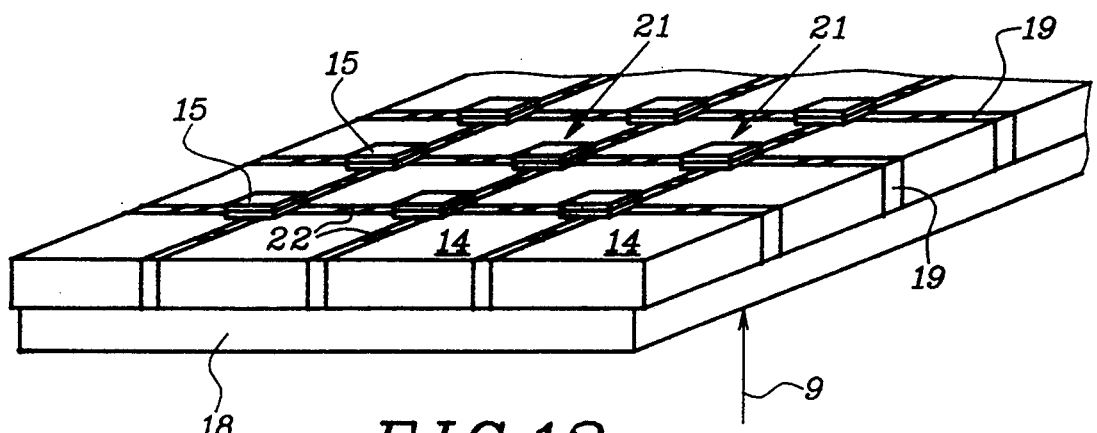
FIG. 12 is a perspective view of the FIG. 10 detector.

FIG. 12 is a perspective view showing the preferred embodiment of a detector of the present invention comprising a matrix of square cells 21. Naturally, without going beyond the ambit of the present invention, the cells 21 could be of some other shape, e.g. triangular, hexagonal, or circular. Similarly, it is possible without going beyond the ambit of the present invention to make a detector that comprises a single cell only made up of one or more superconducting tunnel junctions.

In the embodiment of FIG. 12, each cell 21 is defined by four superconducting tunnel junctions 15 and by four walls 19 terminating at the junctions 15 and disposed in a square. Advantageously, each wall 19 includes a gap 22 halfway between two adjacent junctions 15. As a result, a quasi-particle penetrating into a wall 19 is channelled towards the closer superconducting tunnel junction. The presence of aluminum walls 19 also makes it possible to improve temporal resolution by limiting the time that elapses between a photon being absorbed and the corresponding signal being detected by confining the quasi-particles and thus limiting the propagation paths of the quasi-particles.

Each superconducting tunnel junction 15 is shared equally between four adjacent cells 21, whereas each wall 19 is shared between two cells 21.

Each superconducting tunnel junction 15 is connected to a low-noise amplifier to amplify the current of tunnelling quasi-particles 7'.

In a variant embodiment, the amplifiers are directly diffused in a semiconductor wafer having the same pitch as the superconducting tunnel junctions 15, with the semiconductor wafer being put into contact with the superconducting tunnel junctions 15 of the structure shown in FIG. 12.

Figure 13:
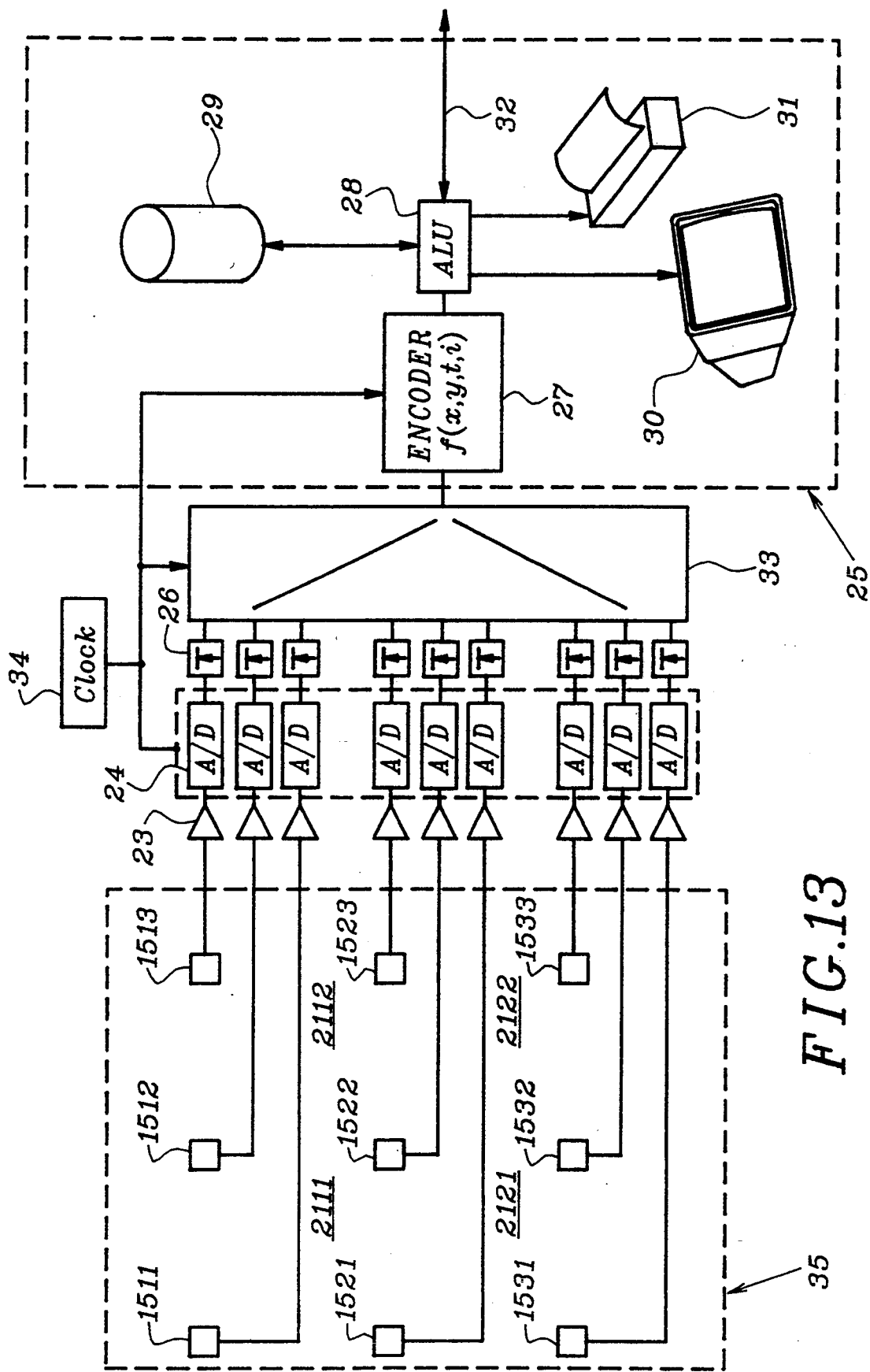
FIG. 13 is a block diagram showing an embodiment of a sensor of the present invention.

FIG. 13 shows an embodiment of a sensor of the present invention comprising four detection cells 2111, 2112, 2121, and 2122. Cell 2111 is defined by superconducting tunnel junctions 1511, 1512, 1521, and 1522. Detection cell 2112 is defined by superconducting tunnel junctions 1512, 1513, 1522, and 1523. Detection cell 2121 is defined by superconducting tunnel junctions 1521, 1522, 1531, and 1532. Detection cell 2122 is defined by superconducting tunnel junctions 1522, 1523, 1532, and 1533.

Each superconducting tunnel junction is connected in series with a low-noise amplifier 23, an analog-to-digital converter 24, and means 25 for encoding and/or processing information.

Advantageously, a threshold comparator 26 is interposed between the output of each analog-to-digital converter 24 and the corresponding input to the means 25 for encoding and/or processing information. Advantageously, the means 25 comprise an encoder 27 that associates each detection signal with an intensity or energy value i proportional to the number of detected quasi-particles, the detection time t, and the number or coordinates of the corresponding superconducting tunnel junction. The encoded data is then transmitted to an arithmetic and logic unit 28 for storage in a mass memory 29 and/or for on-line or off-line processing, display of results on a display device 30, printing by a printer 31, or transmission over a communications line 32 to a remote device (not shown).

In a first variant embodiment (not shown) an encoder 27 is associated with each superconducting tunnel junction. Under such circumstances, it is advantageous to connect the set of encoders 27 to an arithmetic and logic unit 28 via a multiplexer.

In a second variant embodiment, as shown in FIG. 13, the outputs of the threshold comparators 26 are connected via a multiplexer 33 to a single encoder 27.

A very high accuracy clock 34 ensures synchronization of sampling and of multiplexing and encoding conversion.

An interaction with a detection cell, e.g. detection cell 2111, generates some number of quasi-particles, typically several thousands, and a large fraction thereof reach the four superconducting tunnel junctions 1511, 1512, 1521, and 1522. The quasi-particles tunnel through these junctions and thus provide signals that are amplified by the corresponding low-noise amplifiers 23. At the outputs from the amplifiers 23 corresponding to the superconducting junctions of cells 2111, a signal is obtained which is an unambiguous function of the number of quasi-particles detected. At the outputs from the other amplifiers 23, a signal is obtained that comes firstly from free quai-particles present in the material (in very small quantities at very low temperatures) and secondly from the electronic noise of each amplifier 23. When the distance between junctions is small, detection can be performed directly via said junctions.

The signals delivered by the amplifiers 23 are sampled and converted into digital form. The threshold comparators 26 eliminate signals that are too small and that correspond solely to the electronic noise of the amplifiers 23 and to the detection of Cooper pairs breaking without absorbing a photon. Only those signals that correspond to the superconducting tunnel junctions 1511, 1512, 1521, and 1522 are transmitted via the multiplexer 33 to the encoder 27. The encoder 27 generates four data items, each comprising the identity of the superconducting junction, the time of detection, and the intensity of the detected current. The arithmetic and logic unit 28 uses the coordinates of the superconducting tunnel junctions that have transmittes a signal to determine which detection cell(s) has/have interacted with an incident photon. It sums the intensities of the received signal corresponding to detection of a given photon, e.g. by adding together the intensities of the signals transmitted at a time $t_0$ by the superconducting tunnel junctions 1511, 1512, 1521, and 1522. The arithmetic and logic unit deduces therefrom the spatial coordinates of the interaction between the photons and the detector, the time of the interaction, and the energy (and thus the wavelength) of the incident photon. The results are transmitted, displayed, and/or stored. Advantageously, the arithmetic and logic unit 28 performs statistical processing enabling the data collected over a given time interval to be presented.

In a variant embodiment having very high spatial resolution, the arithmetic and logic unit 28 takes account of the current intensity at each superconducting tunnel junction to determine, by interpolation, the coordinates of the point of incidence within the cell in which the photon was detected.

Simultaneous detection of a plurality of photons is extremely rare for a device that has very good temporal resolution and for light sources that are faint, in particularly when processing visible or ultraviolet radiation coming from astronomical objects of very high stellar magnitude. When such detection is performed by two cells that are non-adjacent, i.e. cells that do not have any superconducting tunnel junctions in common, normal processing is not disturbed.

Figure 16:
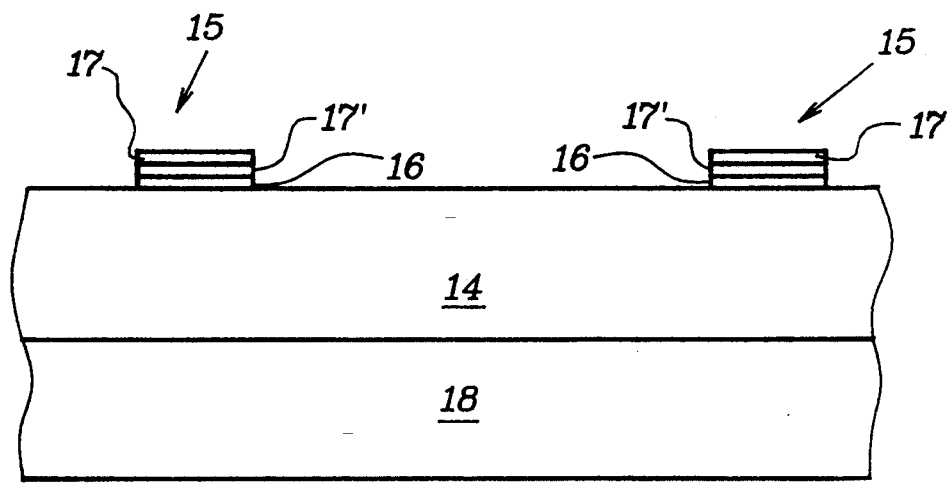
FIG. 16 is a vertical section through a sixth embodiment of a detector of the present invention.

Naturally, the invention is not limited in any way to using niobium for the sensitive elements 14 and aluminum for the walls 19. For example, as shown in FIG. 16, it is possible to use sensitive elements 14 made of a superconducting material whose energy gap $2\Delta$ is small, e.g. aluminum. A superconducting tunnel junction 15 is formed with a sensitive element 14 of aluminum and an electrode 17' of aluminum with a thin insulating barrier 16 being interposed therebetween. It may be advantageous to cover the aluminum layer 17' with a bonding layer 17 made of a metal that facilitates connections, such as niobium, for example.

Figure 17:
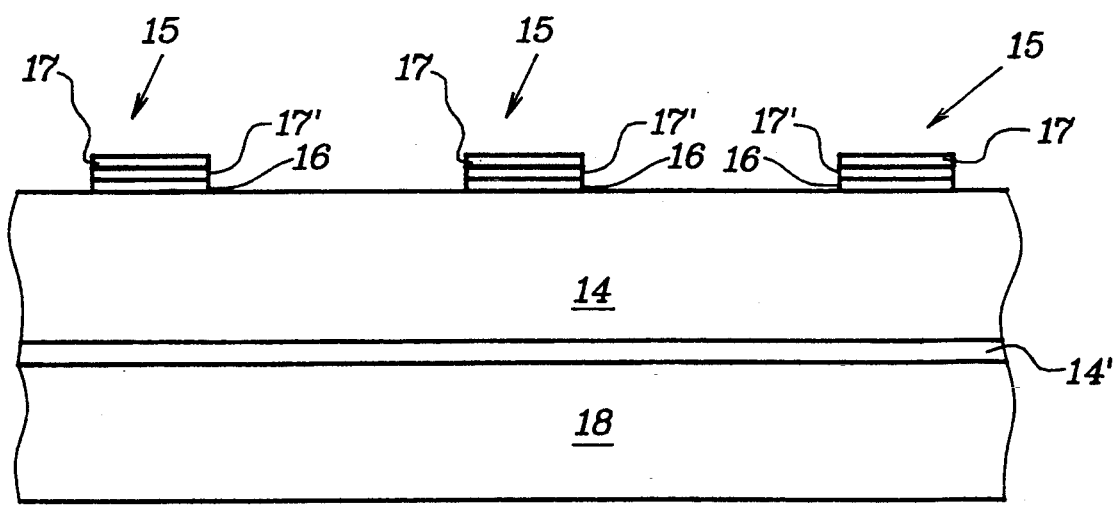
FIG. 17 is a vertical section through a seventh embodiment of detectors of the present invention.

Similarly, as shown in FIG. 17, it is possible to interpose an electrode bonding layer 14' between the support 18 and the sensitive elements 14. In the example of FIG. 17, the superconducting tunnel junctions 15 are closer together, thus enabling temporal resolution to be increased by minimizing the maximum path length travelled by the quasi-particles on their way to the nearest junction. Naturally, without going beyond the ambit of the present invention, this disposition can be combined with the embodiments shown in FIGS. 7 to 12. The present invention is naturally not limited in any way to being implemented using aluminum and niobium. For example, the sensitive element could be of Sn which enables more than 3000 quasi-particles to be obtained on absorption of a 3 eV photon, with spectral resolution substantially equal to 8 nm. The following description provides information enabling the performance of a detection cell or a detector of the present invention to be calculated as a function of the superconducting materials used.

In superconductors, the presence of Cooper pairs 8 represents a fundamental state, whereas the presence of quasi-particles 7' corresponds to an excited state. The number of quasi-particles 7' at an absolute temperature T expressed in K is proportional to $\exp(-\alpha/kT)$, where k is Boltzmann's constant. At low temperature, the number of quasi-particles 7' is extremely low compared with the number of quasi-particles that are generated when the cell interacts with a photon. As shown in FIGS. 2, 3, and 5, the population of quasi-particles 7' depends on the population and on the energy of phonons 10, insofar as the energy gap $2\Delta$ is less than $\hbar \omega_D$, where $\hbar \omega_D$ is the Debye energy. In a system that is relaxing (is not in equilibrium) phonons 10 may have sufficient energy to participate in converting a Cooper pair 8 into two quasi-particles 7'. The population of phonons 10 of energy $\hbar \omega$ greater than the energy gap is coupled to the population of quasi-particles. High energy phonons are produced during absorption of a photon (FIG. 2) and during relaxation of high energy quasi-particles 7'. Phonons of energy less than the energy gap are produced, in particular, during recombination of two quasi-particles 7' into a Cooper pair.

Let the confinement time of quasi-particles in a superconducting film be written $\tau_c$.

$\tau_c$ is given by:

$$\tau_c = e^2 N_{Ef} R_{nn} V \quad (7)$$

where e is the electron charge;

$N_{Ef}$ is the density of states at the Fermi energy;

$R_{nn}$ is the normal resistance of the insulating barrier of the superconducting tunnel junction which provides a measure of the tunnelling probability; and V is the volume of the superconducting film.

$1/\tau_c$ gives the frequency of quasi-particle tunnelling.

Insofar as $R_{nn}$ is proportional to $\exp(2b/A)$ where b is the thickness of the insulating barrier and A is the area of the superconducting tunnel junction, $\tau_c$ depends mainly on the superconductor used, on its thickness, and on the thickness of the insulation, but it is independent of temperature T.

The critical temperature of the superconductor is written $T_c$, and a temperature that is smaller than one-tenth of $T_c$ is written $T_0$. The number of quasi-particles at temperature $T_0$ is proportional to $\exp(-\Delta(0)/kT_0)$ where $\Delta(0)$ is half the energy gap at absolute zero temperature. Absorption of a photon leads to an increase in the population of quasi-particles 7' that can be associated with an equivalent population $N(T^*)$ where $T^*$ is the effective quasi-particle temperature. Relaxation thus depends on $T^*$ which changes as the populations evolve. The recombination time at low temperature is given by the following equation:

$$\tau_r(T^*) \simeq \tau_0 \left[ \pi^{1/2} \left( \frac{2\Delta(0)}{kT_c} \right)^{5/2} \left( \frac{T^*}{T_c} \right)^{1/2} \exp\left(-\frac{\Delta(0)}{kT^*}\right) \right]^{-1} \quad (2)$$

where $\tau_0$ is the confinement time at absolute zero temperature. Since $\tau_r$ is a function of the density of quasi-particles, the relationship between absorbed photon energy and the number of quasi-particles is not linear.

The time associated with the breaking of a Cooper pair 8 into two quasi-particles 7' (FIG. 3), taking the various possible recombinations into account, is given by the following equation:

$$\tau_b(T^*) = \tau_{ph} \frac{\Delta(0)}{\Delta(T^*)} \frac{1}{(1 - 2f(\Delta(T^*)))} \quad (3)$$

where $f(\Delta(T))$ is the Fermi function and $\tau_{ph}$ is a constant. The decrease in the probability of interaction with temperature is due to the fact that there are fewer Cooper pairs suitable for being broken at higher temperatures.

It should be observed that phonons are lost on leaving the superconducting cells. These losses depend on the shape of the detection cell, on the thicknesses of the films concerned, on the sizes of the connection electrodes, and on acoustic coupling between the various elements of a detection cell.

In general, the relaxation of a superconductor with coupling between the phonons and the population of quasi-particles is described in S. B. Kaplan, C. C. Chi, D. N. Langenberg, J. J. Chang, S. Jafarey, and D. J. Scalapino, Phys. Rev. B 14 (1976) 4854 and in J. J. Chang and D. J. Scalapino, Phys. Rev. B 15 (1977) 2651, and can be described by a system of two coupled equations:

$$\frac{dN_{qp}}{dt} = -\frac{N_{qp}}{\tau_c} - \frac{N_{qp}}{\tau_r(T^*)} + \frac{2N_{ph}}{\tau_b(T^*)} - \frac{N_{qp}}{\tau_d} \quad (4)$$

-continued $$\frac{dN_{ph}}{dt} = -\frac{N_{ph}}{\tau_b(T^*)} + \frac{N_{qp}}{2\tau_r(T^*)} - \frac{N_{ph}}{\tau_l}$$

where $N_{qp}$ is the density of quasi-particles;
$N_{ph}$ is the density of phonons;
$\tau_c$ is the quasi-particle confinement time;
$\tau_r$ is the recombination time;
$\tau_d$ is the diffusion time;
$\tau_l$ is a time characteristic of phonon loss; and
$\tau_b$ is a time characteristic of Cooper pair breaking.

The tunnelling current I is given by the following equation:

$$I = \frac{N_{qp}(T^*)(eV_b + \Delta)}{2N_{E_f}eR_{nn}((eV_b + \Delta)^2 - \Delta^2)^{1/2}} \quad (5)$$

where $V_b$ is the bias voltage;
$0 < eV_b < 2\Delta$.

On absorption of a photon, the mean number of excess charge carriers created in the superconductor, $N_0$, can be written:

$$N_0 = E/\epsilon \quad (6)$$

where $E = h\nu$ is the incident photon energy and $\epsilon$ is the mean energy required for creating a charge carrier. The spectral resolution of the detector, defined as the width of the sensed energy distribution coming from monochromatic radiation at half-height relative to maximum energy, is given by:

$$\Delta E = 2.35\sqrt{FE\epsilon} \quad (7)$$

where F is the Fano factor defined by:

$$\text{Var}(N_0) = FN_0 \quad (7')$$

An approximate solution to equation (4) is given by:

$$\frac{N}{N_0} = \frac{\tau_c^{-1}}{\tau_c^{-1} + <\tau_r^{-1}> + \tau_d^{-1}} \quad (8)$$

where $<\tau_r^{-1}>$ is a time-averaged value of the effective recombination time of Cooper pairs from quasi-particles 7'.

In a practical embodiment: niobium photosensitive elements have an area lying in the range 150 $\mu m^2$ to 400 $\mu m^2$, a thickness lying in the range 50 nm to 300 nm, $\tau_c$ lying in the range 60 ns to 5000 ns (with $\tau_c$ equal to 60 ns for the smallest value of the resistance $R_{nn}$ equal to 0.6 $\Omega$), and the volume is equal to 20 $\mu m^3$. It is probable that $\tau_c$ could be reduced to 10 ns by reducing the size of the junction. $\tau_c$ could be further reduced by a factor of 2.5 which is the ratio of the value of $N_{Ef}$ for Nb relative to its value for Al. In solid niobium at a temperature of less than 2 K., $\epsilon$ may be estimated at 1.747$\Delta$ and F at 0.22. From this it can be deduced that 1100 quasi-particles 7' can be expected for a photon of energy equal to 3 eV. It should be observed that it is not at all advantageous to increase the area or the thickness of the sensitive element 14. Although such an increase leads to higher sensitivity (greater probability of interaction between incident radiation and matter), it also increases capacitance, thereby degrading spectral resolution, while an increase in thickness reduces current intensity for a given number of quasi-particles. Given that the density of charges generated in the superconductor by visible or UV photons is low and therefore increases the probability of quasi-particles 7' recombining into a Cooper pair only slowly, it appears to be particularly advantageous to use matrix detectors comprising detection cells of small area. The Applicant envisages making cells of 3 $\mu$m by 3 $\mu$m and with a thickness of 0.01 $\mu$m.

The signal/noise ratio may be improved by eliminating signals whose time behavior does not correspond to a signal due to absorption of a photon.

For such a thickness, it may be advantageous to use an absorbent layer that converts the energy of an incident photon into high energy phonons (FIGS. 4 and 11).

When using niobium, energy resolution may be estimated at 0.1 eV, corresponding to spectral resolution of 13 nm at 400 nm.

When walls 19 are present, spatial resolution depends on the size of the detection cells, and otherwise it depends on the diffusion of the quasi-particles for a length of time $\tau$. The diffusion of quasi-particles at a time $\tau$ is a function of the mean free path $\lambda_{qp}$ and of the Fermi velocity $v_F$. For niobium, it can be estimated that for $\tau$ equal to 1 $\mu$s, diffusion may take place over 1 mm. For a thin film, quasi-particle diffusion satisfies the following equation for two-dimensional diffusion:

$$\frac{\partial^2 u}{\partial x^2} + \frac{\partial^2 u}{\partial y^2} = \frac{1}{k}\frac{\partial u}{\partial t} \quad (9)$$

which must satisfy the following limit conditions:

$$u(0,y,t) = u(l,y,t) = u(x,0,t) = u(x,l,t) = 0 \; t \geq 0 \quad (10)$$
$$u(x,y,0) = N\delta(x - x_0, y - y_0) \; 0 \leq x_0 \leq l, \; 0 \leq y_0 \leq l$$

The solution may be written in the form:

$$u(x,y,t) = \quad (11)$$

$$N \sum_{r=1}^{\infty} \frac{2}{l} \sin\left(\frac{r\pi x_0}{l}\right) \sin\left(\frac{r\pi x}{l}\right) \exp-\left(\frac{r^2\pi^2 kt}{l^2}\right) \times$$

$$\sum_{s=1}^{\infty} \frac{2}{l} \sin\left(\frac{s\pi y_0}{l}\right) \sin\left(\frac{s\pi y}{l}\right) \exp-\left(\frac{s^2\pi^2 kt}{l^2}\right)$$

and the quasi-particle current through the limit for $x = x_b$ is given by:

$$\int_{y_1}^{y_2} \int_0^{\infty} \frac{\partial u}{\partial x}\Big|_{x=x_b} dt dy = \quad (12)$$

$$\frac{4N}{\pi^2 k} \sum_{r=1}^{\infty} \sum_{o=1}^{\infty} \frac{r}{o} \frac{1}{r^2 + s^2} \cos\left(\frac{r\pi x_b}{l}\right) \sin\left(\frac{r\pi x_0}{l}\right) \times$$

$$\sin\left(\frac{s\pi y_0}{l}\right)\left[-\cos\left(\frac{s\pi y}{l}\right)\right]_{y_1}^{y_2}$$

The same particle flow can be determined at the limit $y = y_b$.

The flows of particles through given limits can be determined on the basis of equation (12).

This theoretical distribution has been compared with a random path statistical model using "Monte-Carlo" statistics, which shows a divergence of 2% between two models for $N_0 = 1100$, giving rise to a spatial resolution of 20 μm for superconducting tunnel junctions that are 1 mm apart. This calculation is based on the assumption that all of the quasi-particles 7' reaching a superconducting tunnel junction are detected. This assumption is substantially true at the temperatures used, where the probability of Cooper pair recombination is very low. Similarly, the spatial resolution calculation ignores back tunnelling current (from the amplifier device towards the walls 19).

The relevant characteristics of various low temperature superconductor materials that are suitable for use in a detection cell of the present invention can be seen from Table 1 below.

TABLE 1

| Bulk material Ref. | $T_o$ (K) [30] | $\Delta(0)$ (meV) [31] | $\tau_0$ (ns) [13] | $\tau_{ph}$ (ns) [13] | $v_F$ ($10^6$ ms$^{-1}$) [30] | $N_{Ej}$ ($10^{31}$ states eV$^{-1}$ cm$^{-3}$) [13] |
|---|---|---|---|---|---|---|
| Nb | 9.3 | 1.525 | 0.149 | 0.004 | 1.37 | 31.7 |
| Pb | 7.2 | 1.37 | 0.196 | 0.034 | 1.83 | 8.6 |
| Ta | 4.5 | 0.7 | 1.78 | 0.023 | — | 40.8 |
| Sn | 3.7 | 0.57 | 2.30 | 0.110 | 1.90 | 8.1 |
| Al | 1.2 | 0.17 | 438 | 0.242 | 2.03 | 12.2 |

The preferred embodiment of the device of the invention uses three materials respectively for the sensitive element 14, for the walls 19, and for the superconducting tunnel junctions 15, said materials having decreasing energy gaps $2\Delta$ so as to enhance transfer of quasi-particles 7'.

The device of the present invention may be implemented in a spectroscope.

In a first embodiment of a spectroscope of the present invention, a sensor of the type shown in FIG. 13 and includes a large number of cells 21. The spectral resolution of the FIG. 13 device comes directly from the energy resolution of the detector of the present invention.

Figure 14:
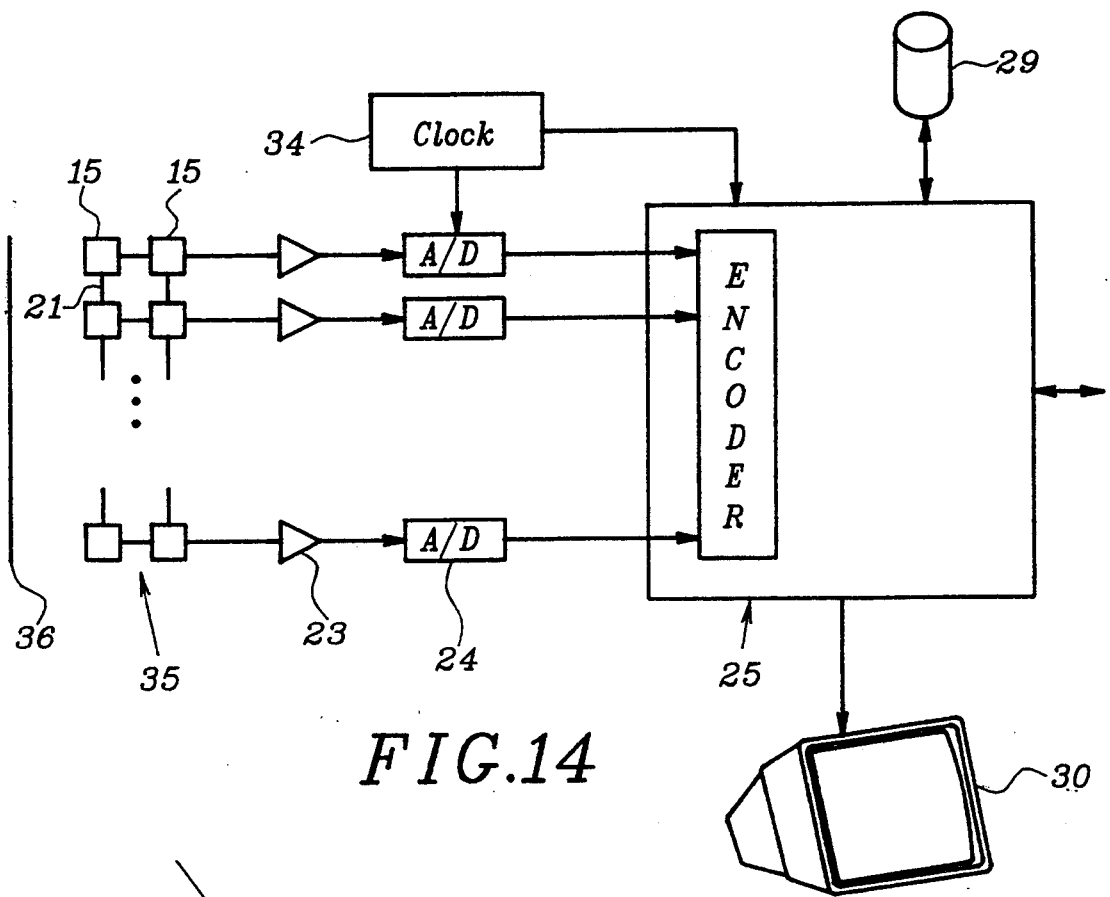
FIG. 14 is a block diagram of an embodiment of a spectroscope of the present invention.

FIG. 14 illustrates a second embodiment of a spectroscope of the present invention that comprises a detector 35 which is advantageously linear and which is placed behind a dispersing device, e.g. a diffraction grating 36. The outputs from the junctions 15 are connected in a manner analogous to that of the device in FIG. 13 to a data storage and/or processing unit 25.

The spectrometer of FIG. 14 has excellent spectral resolution due firstly to the presence of the diffraction grating 36 and the spatial resolution of the detector 35, and secondly to the spectral resolution of the detector itself.

The performance of a detector of the present invention depends mainly on the characteristics of each detection cell, however it may be degraded by the noise generated by the amplifier 23, particularly if the electric charge (number of quasi-particles 7') generated by a detected photon 9 is small. Amplifier noise may be reduced firstly by cooling, e.g. down to the working temperature of the superconducting junctions. Noise may also be reduced by signal processing as shown in FIGS. 18 to 24.

Figure 18:
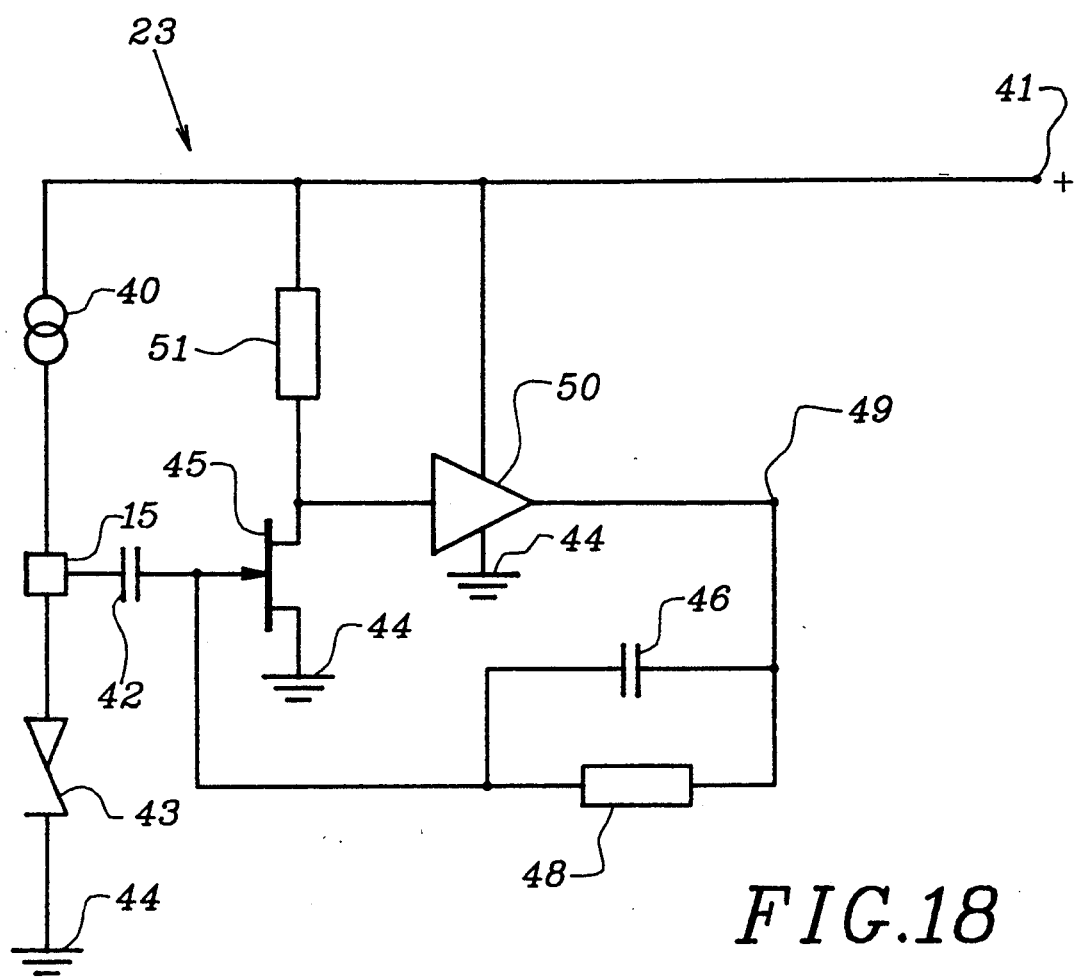
FIG. 18 is an electrical circuit diagram of a first example of an amplifier suitable for use in a detector of the present invention.

FIG. 18 shows a first amplifier 23 which is particularly suitable for use with very low illumination levels (long periods of time between cell interactions with successive photons 9). The superconducting tunnel junction 15 is connected to a current generator 40, to a positive feed terminal 41, to a first plate of a capacitor 42, and via a zener diode 43 to ground 44. The second plate of the capacitor 42 is connected to the grid of a field effect transistor (FET) 45, to a first plate of a capacitor 46, and to the input of a resistor 48. The second plate of the capacitor 46 and the output of the resistor 48 are connected to a terminal 49 on which the amplified output signal is made available. A first electrode of the FET 45, e.g. its drain, is connected to ground 44. The second electrode of the FET 45, e.g. its source, is connected firstly to the input of an amplifier 50 and secondly via a resistor 51 to the positive terminal 41. The power supply terminals of the amplifier 50 are connected to ground 44 and to the positive terminal 41. The output from the amplifier 50 is connected to the output terminal 49 of the amplifier as a whole 23. In one embodiment, the resistor 48 may have a resistance of 300 MΩ, and the capacitor 46 may have a capacitance of one pF.

The amplifier 23 of FIG. 18 may be optimized for measuring the energy of a sensed photon 9 by using a longer amplifier time constant. In contrast, by giving the amplifier a shorter time constant, the dead time between two detectable photons is reduced. With a long time constant, in order to be capable of reliably measuring the detection cell charge that corresponds unambiguously with photon energy, two successive photons must be spaced apart in time by at least one microsecond. Otherwise, if the amplifier time constant is of the same order as the relaxation time of the superconducting tunnel junction, the total charge induced by the photon in the detection cell cannot be measured accurately.

FIG. 19 shows how the amplifier 23 of FIG. 18 behaves when accurately measuring the charge induced in a detection cell.

Figure 19A:
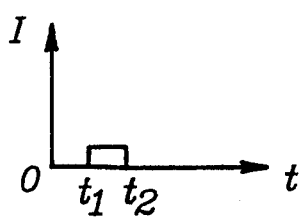
FIGS. 19a–19c illustrate the signal processing performed by the FIG. 18 amplifier.

In FIG. 19a, current I as delivered by the junction that is connected to the amplifier 23 is plotted as a function of time t. The current is substantially equivalent to a squarewave pulse signal between times $t_1$ and $t_2$.

Figure 19B:
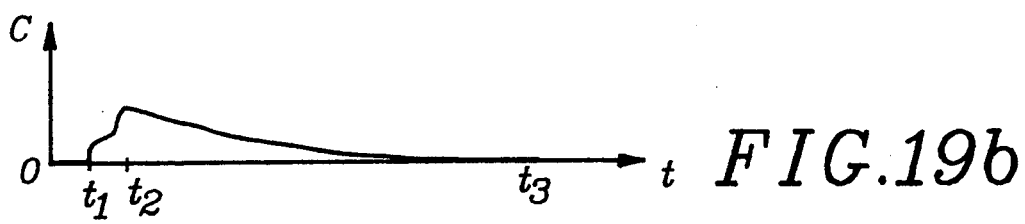

FIG. 19b shows charge C as a function of time t in the detection cell. Time $t_1$ corresponds to a photon 9 being captured. Between $t_1$ and $t_2$, the superconducting tunnel junction 15 relaxes and the number of quasi-particles 7' is amplified. Between $t_2$ and $t_3$, the junction 15 discharges into the amplifier 23 with charge diminishing exponentially in application of the equation $Ae^{-t/\tau_c}$, where $\tau_c$ typically lies in the range 10 μs to 300 μs.

Figure 19C:
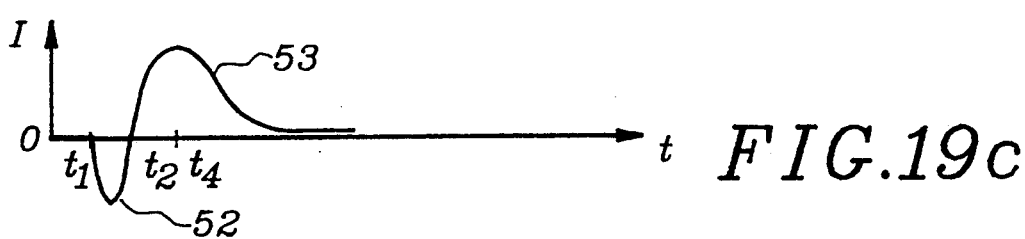

FIG. 19c shows the signal I delivered by the amplifier 23 as a function of time t. Since the signal is zero until $t_1$, it includes a negative half-cycle 52 between $t_1$ and $t_2$ followed by a positive half-cycle 53. The shape of said positive half-cycle 53 is used in the arithmetic and logic unit 28 during signal processing to determine the total charge delivered by the superconducting tunnel junction 15.

FIG. 20 shows an amplifier 23 including processing means for separating signals generated by a plurality of photons 9 that are detected at short intervals. This circuit is particularly suitable for medium levels of illumination, e.g. when observing astronomical objects of medium or low stellar magnitude. The circuit of FIG. 20 comprises a charge amplifier 54 connected to the output of the superconducting tunnel junction 15. The output of the amplifier 54 is connected to the input of a circuit 55 for pole zero cancellation. The output of the pole zero cancellation circuit 55 is connected to the input of a controller 56 and to the analog inputs of a series of sample-and-hold circuits 57, e.g. to the inputs of three sample-and-hold circuits 57.1, 57.2, and 57.3. The controller 56 is connected by control lines to the various sample-and-hold circuits 57. The digital outputs from the sample-and-hold circuits 57 are connected to the storage unit 29, e.g. via the arithmetic and logic unit 28.

We now refer to FIGS. 21 and 22 while explaining the operation of the FIG. 20 circuit.

FIGS. 21a and 21b are analogous respectively to FIGS. 19a and 19b, but they represent the capture of three photons at times $t_{11}$, $t_{21}$, and $t_{31}$.

In FIG. 21b, charge initially increases between $t_{11}$ and $t_{12}$ following relaxation of the junction 15 after the first photon has been detected, and then decreases exponentially from $t_{12}$ to $t_{21}$. Between $t_{21}$ and $t_{22}$, charge increases from the residual charge level remaining from capture of the first photon, during relaxation of the junction following capture of the second photon. From $t_{22}$ to $t_{31}$, total charge decreases exponentially. Between $t_{31}$ and $t_{32}$, the residual charge is increased during relaxation of the junction 15 following capture of the third photon. From $t_{32}$ to $t_3$ the charge decreases exponentially until it reaches a zero value.

FIG. 22c shows the poles corresponding to the various photons being detected.

FIG. 22 shows the signals 58.1 to 58.3 generated by the controller 56 and controlling the samplers 57.1 to 57.3, respectively. On capture of the first photon, the signal 58.1 takes up the high level enabling the sampler 57.1 to sample the received charge, and this continues until $t_3$, for example. The signal 58.2 includes a pulse on capture of the first photon and switches from low level to high level on capture of the second photon, remaining at high level until $t_3$, for example. The signal 58.3 has a pulse at the moment the second photon is captured and switches to high level when the third photon is captured. The arithmetic and logic unit 28 reconstitutes the charges corresponding to the various photons firstly by calculating the charge generated by the interaction with the first photon on the basis of the information available between $t_{12}$ and $t_{21}$. Thereafter, by subtracting this charge from the charge measured at $t_{22}$ and $t_{31}$, the arithmetic and logic unit 28 determines the charge generated by the interaction with the second photon. Similarly, by subtracting the charge of the second photon, the arithmetic and logic unit determines the charge generated during interaction with the third photon.

Naturally, an amplifier 23 having more than three samplers 57 would not go beyond the ambit of the present invention.

Figure 23:
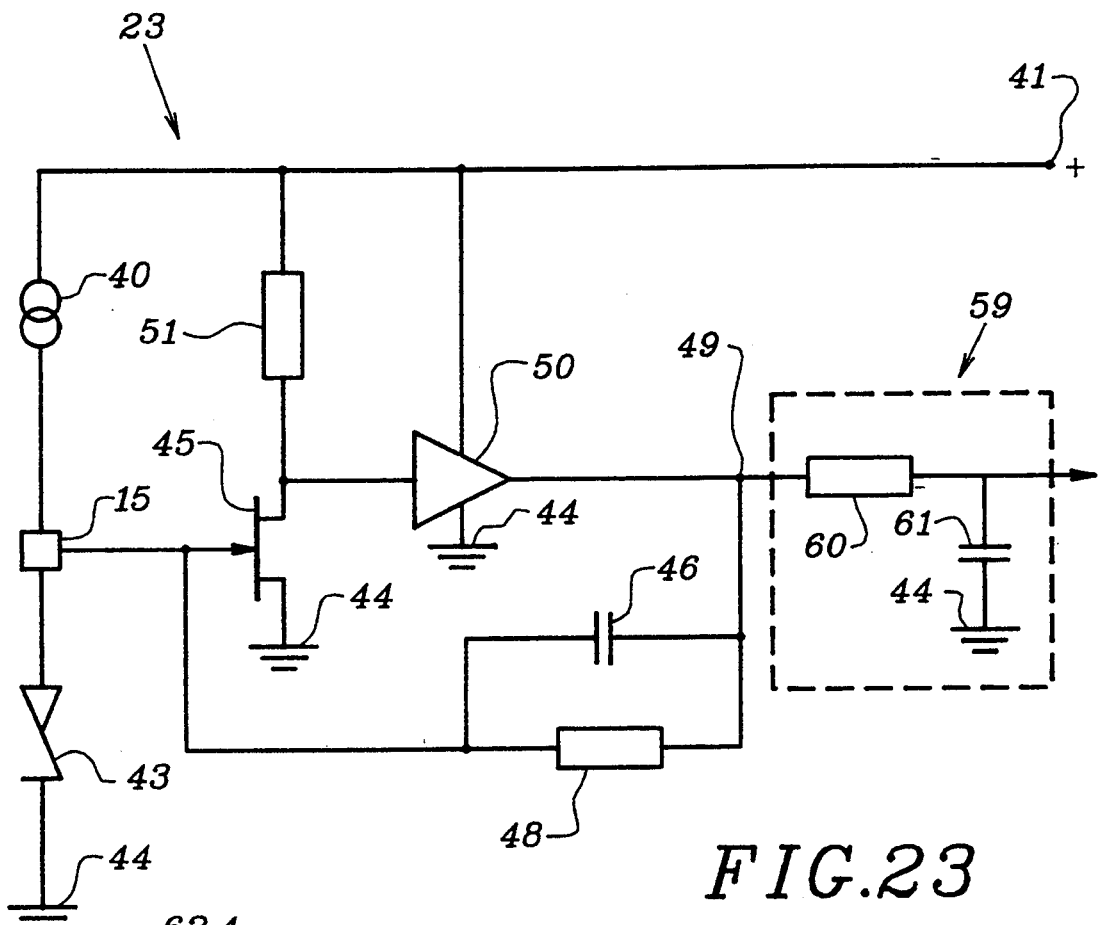
FIG. 23 is a diagram of a third embodiment of an amplifier of the invention.

It may be advantageous, particularly at high levels of illumination, where there is a high probability of simultaneous interaction between the sensitive element 14 in a single detection cell with a plurality of photons 9, to obtain a signal whose value, e.g. voltage, is a function of the light intensity to be measured. An example of an amplifier 23 suitable for delivering an analog signal representative of the intensity with which a detection cell is illuminated is shown in FIG. 23, and is substantially identical to the amplifier 23 of FIG. 18 plus an integrator circuit 59 at its output 49 constituted, for example, by a resistor 60 connected in series with a capacitor 61 connected between the output of the resistor 60 and ground 44. Advantageously, the amplifier 23 of FIG. 23 may be switched depending on the instantaneous level of illumination between delivering the measured individual energies of incident photons on output terminal 49 and delivering a value representative of continuous illumination at the output of the integrator circuit 59.

The operation of the amplifier 23 is explained with reference to FIGS. 24a to 24c.

Figure 24A:
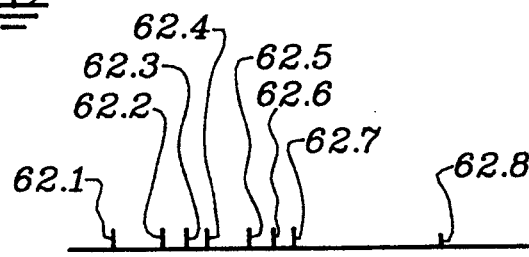
FIGS. 24a–24c are waveform diagrams comprising three curves illustrating the signal processing performed by the FIG. 23 amplifier.

In FIG. 24a, references 62.1 to 62.8 represent successive instants at which incident photons interact with a detection cell of the present invention.

Figure 24B:
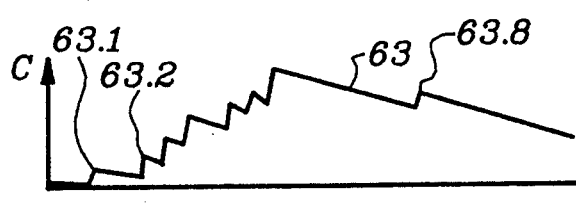

In FIG. 24b, there can be seen a curve 63 which corresponds to the charge C generated by interaction with the photons 62.1 to 62.8 and the detection cell as sensed by the junction 15 connected to the amplifier 23.

Figure 24C:
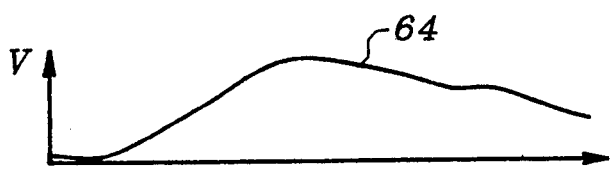

In FIG. 24c, there can be seen a curve 64 representing a signal, e.g. a voltage V, whose value as function of time is representative of the illumination received by the detection cell of the present invention.

FIGS. 25 to 28 show the performance obtained from a prototype detection cell comprising a single superconducting tunnel junction of niobium occupying a square of size 12 μm and operating at 0.3K. The superconducting tunnel junction was connected to an amplifier 23 that generates considerable noise, so it was not possible in this particular experiment to demonstrate that individual photons are being counted.

Figure 25:
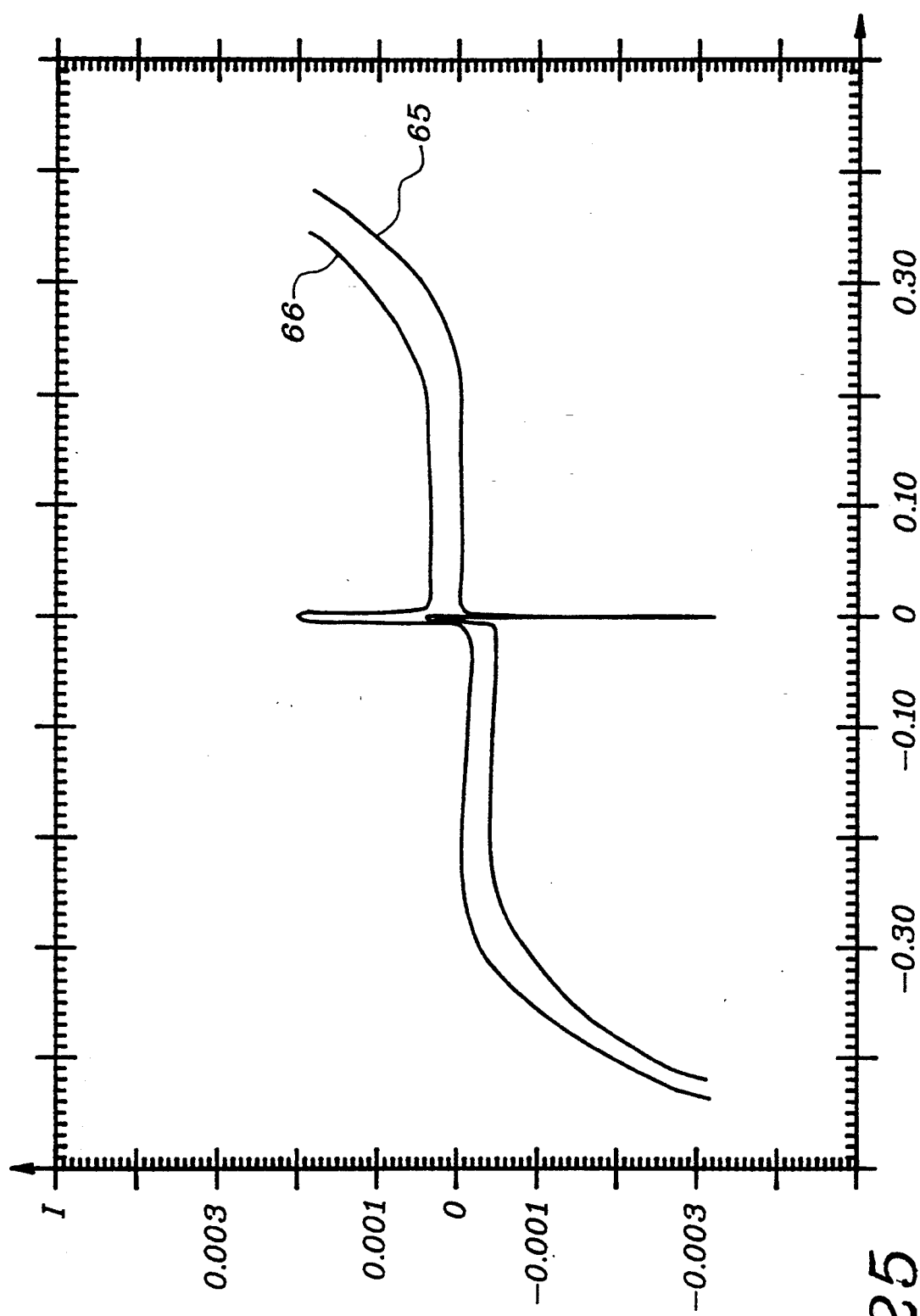
FIG. 25 is a graph showing current as a function of bias voltage in an embodiment of a detector of the present invention.

In FIG. 25, the illumination I expressed in μA is plotted as a function of the bias voltage of the superconducting tunnel junction expressed in mV. Curve 55 corresponds to current as a function of bias voltage for a detection cell that is not illuminated.

Curve 66 corresponds to current as a function of voltage for a cell that is illuminated by radiation at 1000 nm. Compared with curve 65, it can be seen that the current through the superconducting tunnel junction 15 is substantially negligible for a bias voltage of less than 0.3 mV. This voltage is therefore advantageously adopted as the bias voltage for the superconducting tunnel junction. The current difference I between curves 66 and 65 is extremely large and enables illumination of the cell to be detected.

Figure 26:
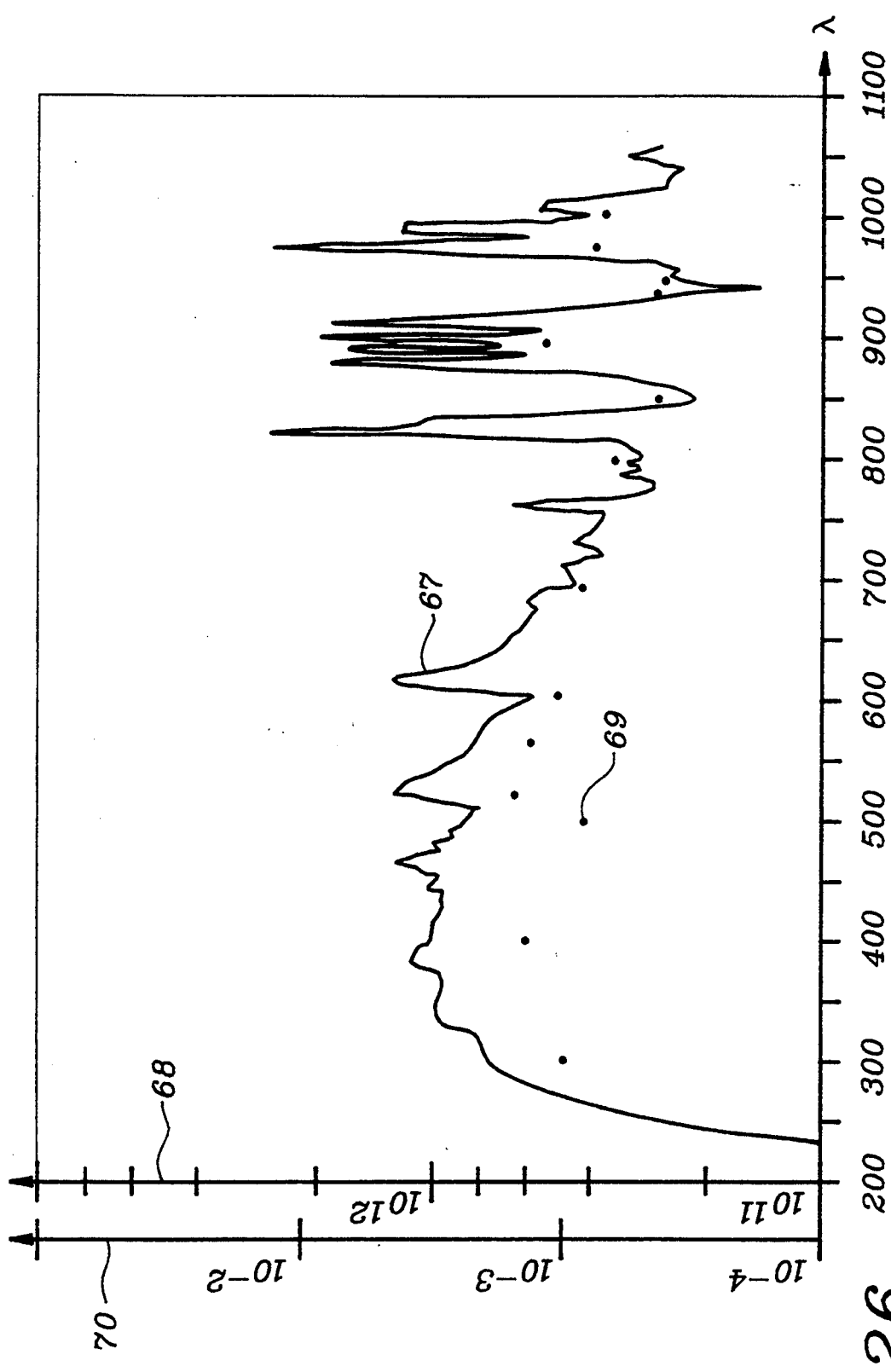
FIG. 26 shows the frequency response of a detector of the present invention.

FIG. 26 shows firstly a curve 67 showing frequency response expressed in photons per second on a logarithmic scale 68 of a light source as a function of wavelength λ expressed in nm, and secondly a curve showing the current 69 expressed in μm on a logarithmic scale 70 flowing through a superconducting tunnel junction of the above-specified detection cell and normalized for a wavelength of 250 nm. For wide spectrum illumination, good correlation is obtained between emitted light intensity and electrical current intensity through the superconducting tunnel junction.

Figure 27:
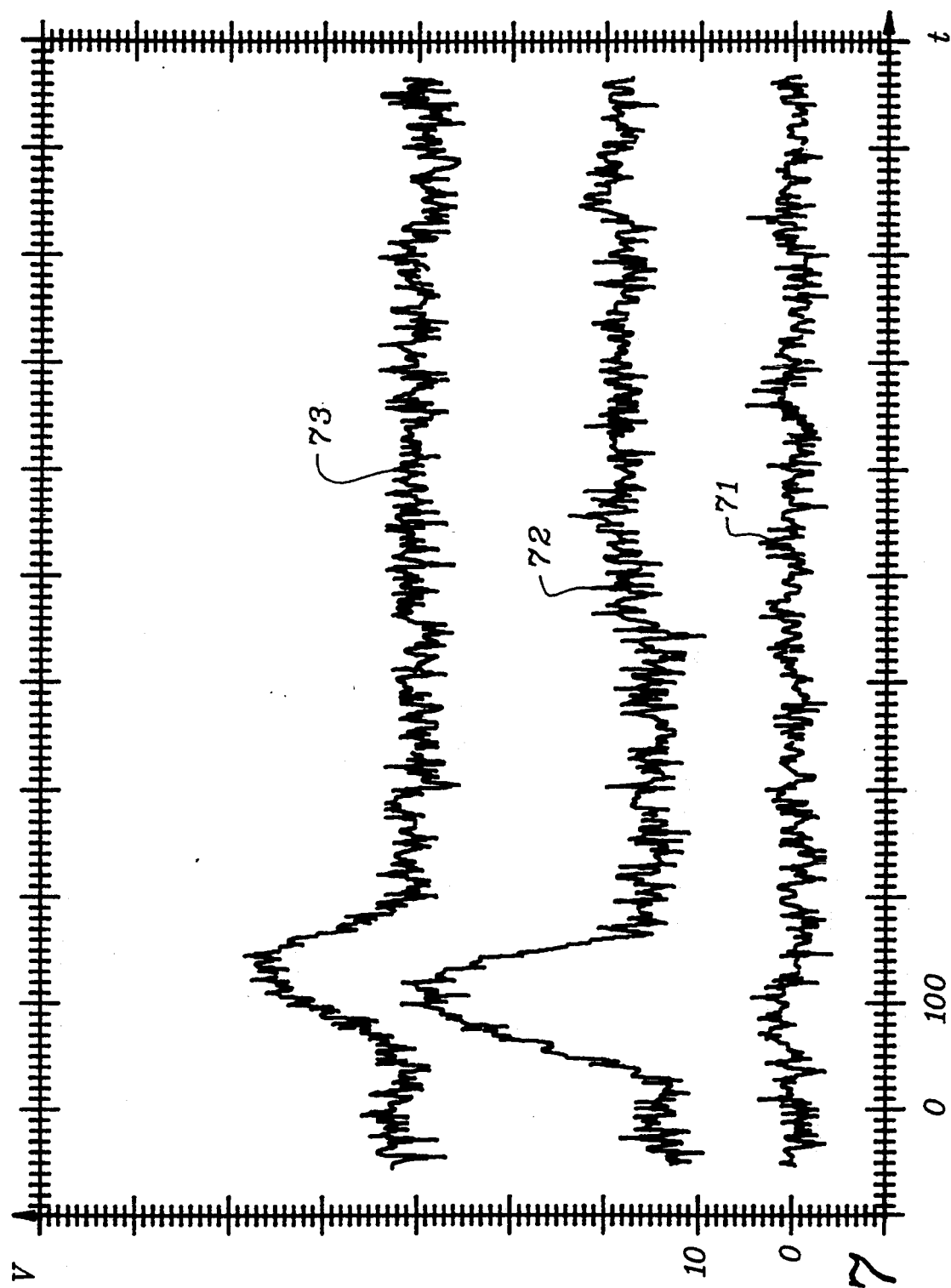
FIG. 27 shows signal levels for two packets of photons corresponding to two different wavelengths compared to a system baseline noise.

FIG. 27 shows the output voltage after the preamplifier stage of the superconducting tunnel junction of the detection cell of the present invention as a function of time t. One division on the time scale t corresponds to 100 μs (subdivided into ten subdivisions of 10 μs each). The three curves 71, 72, and 73 are displaced relative to one another in the voltage direction V. One division in the voltage scale V corresponds to 10 mV (subdivided into ten subdivisions of 1 mV each). Curve 71 corresponds to noise in the absence of illumination. Curve 72 corresponds to a pulse of photons at a wavelength substantially equal to 400 nm. Curve 73 corresponds to a pulse of photons at a wavelength substantially equal to 1000 nm.

The pulses have a duration of about 1 μs and each of them corresponds to several hundreds of photons. The time spread of the pulses in curves 72 and 73 can be explained by the response time of the amplification chain connected to the output of the superconducting tunnel junction, with physical effects within the detection cell being of the order of 1 μs.

The curves 72 and 73 prove that detection cells of the present invention can be implemented for detecting short pulses of photons at low levels of illumination over a broad spectrum.

Figure 28:
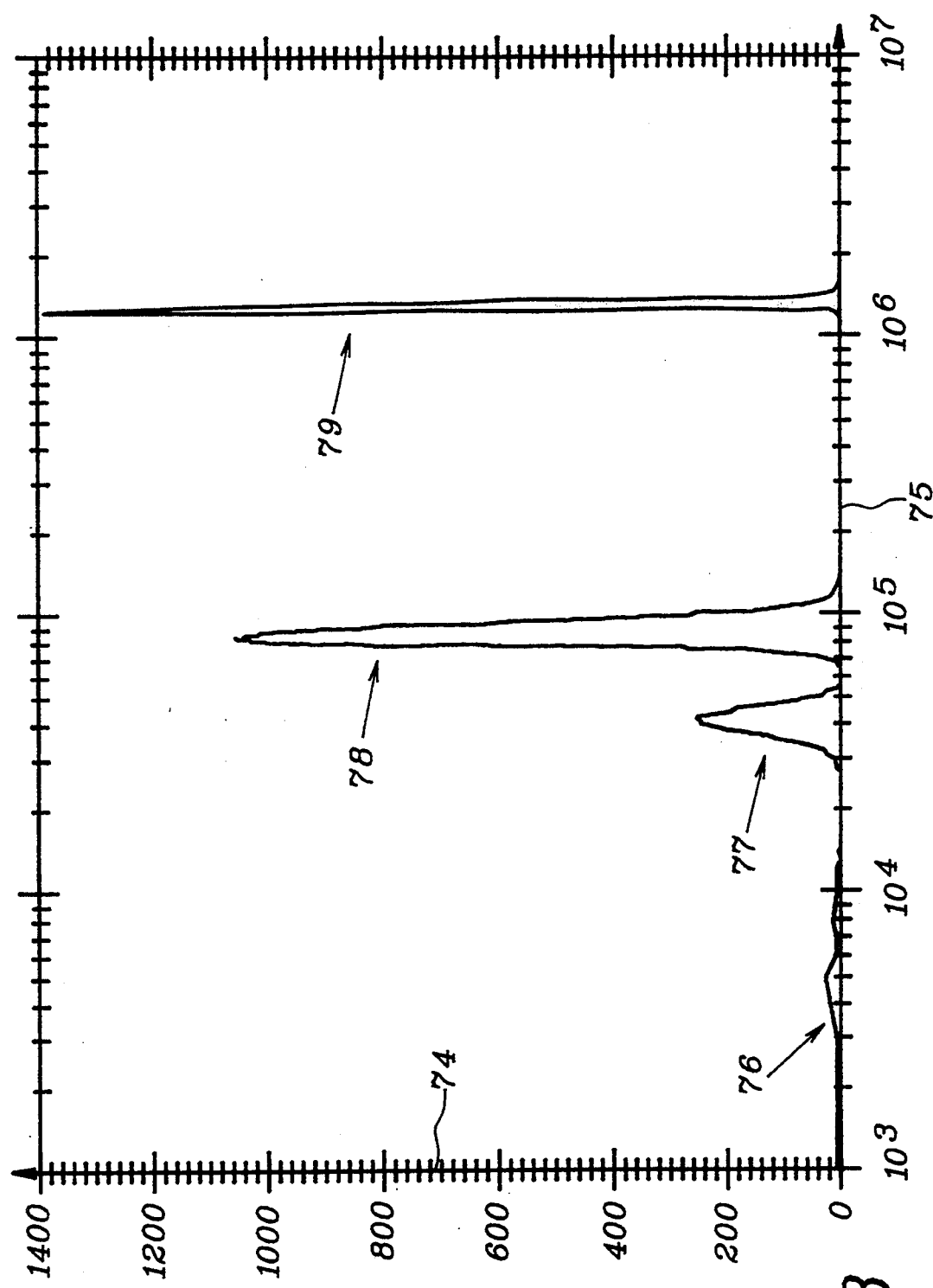
FIG. 28 shows the electrical charge generated in a detector of the present invention by packets of photons.

FIG. 28 shows the number of light pulses on a scale 74 as a function of charge on a scale 75 expressed in terms of the number of electrons picked up from the terminals of superconducting tunnel junction 15 in a cell of the present invention. The light pulses were at a wavelength of 820 nm and they had a duration of 1 μs. A non-cooled conventional amplifier was used providing noise referenced 76 in FIG. 28. Reference 77 shows the distribution of 70-photon pulses. Reference 78 shows the distribution of 150-photon pulses. Reference 79 shows the distribution of 2250-photon pulses. The number of photons per pulse was estimated theoretically, and also from the width of the distribution. From the distribution width, it can be expected that 20-photon pulses are detectable using the amplifier of this experiment. To count individual photons it would be necessary either to increase the number of quasi-particles per photon, e.g. by using junctions based on aluminum and/or to use a low-noise amplifier 23, e.g. an amplifier cooled to the temperature of the superconducting tunnel junctions.

Figure 15:
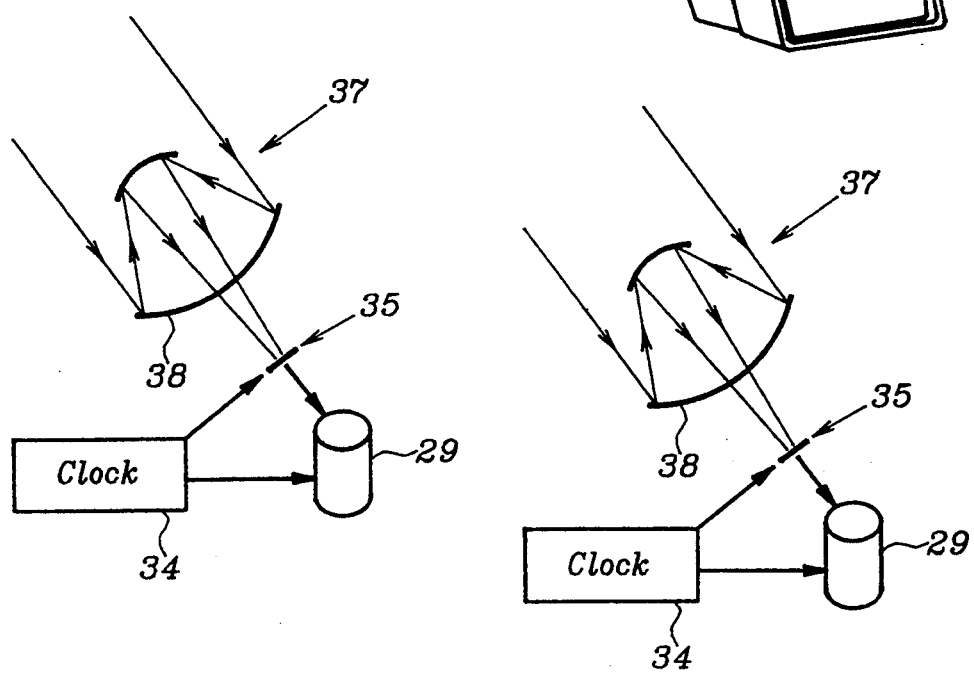
FIG. 15 is a diagram of an embodiment of an interferometer of the present invention.

FIG. 15 shows an example of an interferometer of the present invention which makes it possible, in particular because of the excellent temporal resolution of detectors of the present invention, to pick up coherent radiation from astronomical objects. Such coherent radiation corresponds to radiation that has not been disturbed by atmospheric turbulence (called "speckle" in the art). The device comprises two subassemblies 37 that are identical, each comprising a small diameter telescope 38 having a sensor of the present invention placed at its output, e.g. the sensor shown in FIG. 13. The clocks 34 of the subassembly 37 operate synchronously during data acquisition. This synchronization is obtained either by synchronizing the clocks 34 to each other or by synchronizing them to a master clock, or by using clocks of extreme accuracy, e.g. atomic clocks.

The subassemblies 37 of a FIG. 15 interferometer are spaced apart at a distance that may lie in the range 100 meters to several hundred kilometers or even more. The telescopes 38 of the subassemblies 37 are aimed very accurately in the same direction in azimuth and in elevation. When processing the data picked up by the subassemblies 37, account is taken only of coherent information (constructive interference) corresponding to information that has not been disturbed by atmospheric turbulence.

Similarly, a sensor of the present invention may be applied to the output of a conventional telescope for observing an astronomical body of high or very high stellar magnitude. A device of the present invention can be used to pick up information that is additional to the information that can be picked up by a conventional device while simultaneously reducing exposure time, thereby making it possible to perform a larger number of observations with a single telescope.

The device of the present invention is applicable to counting photons and thus mainly to acquiring and processing information coming from faint sources of radiation.

Although the invention is mainly applicable to astronomy, it may also be used in medical applications (detecting attenuated light, tomography, etc. . . . ), and to acquiring images through the atmosphere (coherent detection, photography, adaptive optics) in devices for night vision, or the like.

We claim:

1. A cell for detecting photons, the cell comprising a superconducting element, in particular made of niobium or of aluminum, that is sensitive to a photon of the radiation to be detected, or to phonons generated by such a photon by breaking Cooper pairs into quasi-particles and by means of a superconducting tunnel junction including a superconducting electrode, wherein, at its operating temperature, the photosensitive superconducting element has characteristics of energy gap $2\Delta$ and of thickness that enable the energy of each quasi-particle coming from a broken Cooper pair to be reduced while multiplying the number of quasi-particles by a factor comprised between 100 and 1000 in a spectrum extending from near infrared to ultraviolet.

2. A detection cell according to claim 1, wherein it is delimited by a plurality of spaced-apart superconducting tunnel junctions distributed around the periphery of the cell.

3. A detection cell according to claim 1, wherein it is delimited by a plurality of close-together superconducting tunnel junctions distributed around the periphery of the cell.

4. A cell according to claim 1, including walls around its periphery and terminating at the superconducting tunnel junctions, the walls being made of superconducting material, in particular Al, having an energy gap $2\Delta_2$ that is less than the energy gap $2\Delta_1$ of the material of the sensitive element, such that said walls form channels for channelling the quasi-particles towards superconducting tunnel junctions, and the number of quasi-particles increases after a quasi-particle has diffused from the sensitive elements into a wall.

5. A cell according to claim 4, wherein its walls include discontinuities, preferably halfway between two adjacent superconducting tunnel junctions.

6. A cell according to claim 1, wherein the sensitive element is of small thickness and is deposited on a substrate that is transparent to the electromagnetic radiation to be sensed.

7. A cell according to claim 6, including a thin layer that absorbs the radiation to be sensed, said layer being disposed between the support and the sensitive element.

8. A cell according to claim 1, wherein the superconducting tunnel junction is made of aluminum covered by a niobium electrode-bonding layer.

9. A detector comprising a plurality of cells according to claim 1, in particular a linear detector comprising cells aligned along an axis, or a matrix detector comprising cells aligned along rows and columns.

10. A sensor including a cell including to claim 1, or a detector according to claim 9, including a low-noise amplifier connected to each superconducting tunnel junction to amplify the current of quasi-particles tunnelling through the junction.

11. A sensor according to claim 10, including analog-to-digital converters for digitizing the signals delivered by the amplifiers, and means for processing and/or storing the digitized signals.

12. A sensor according to claim 11, including encoding means responding to each digitized value of the signal delivered by an amplifier by delivering information relating to the position of the corresponding superconducting tunnel junction, the time of reception, and the value of the amplified current.

13. A sensor according to claim 10, including signal-shaping means and computer means for determining the charge induced in the superconducting tunnel junction by the photon to be detected on the basis of the shape of the signal transmitted by the signal-shaping means.

14. A sensor according to claim 10, including means for sampling the signal over time intervals that correspond to the detection of successive photons, and means for deducing therefrom the individual energy of each of the photons.

15. A sensor according to claim 10, including means for integrating the charge induced in a superconducting tunnel junction by a plurality of photons.

16. A spectroscope, including a sensor according to claim 10.

* * * * *